(12) United States Patent
Cho et al.

(10) Patent No.: US 11,600,336 B2
(45) Date of Patent: Mar. 7, 2023

(54) PAGE BUFFER CIRCUITS AND NONVOLATILE MEMORY DEVICES INCLUDING THE SAME

(71) Applicant: Samsung Electronics Co., Ltd., Suwon-si (KR)

(72) Inventors: Yongsung Cho, Hwaseong-si (KR); Byungkwan Chun, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/332,350

(22) Filed: May 27, 2021

(65) Prior Publication Data

US 2022/0051729 A1 Feb. 17, 2022

(30) Foreign Application Priority Data

Aug. 13, 2020 (KR) .......................... 10-2020-0101529
Dec. 15, 2020 (KR) .......................... 10-2020-0175022

(51) Int. Cl.
*G11C 16/24* (2006.01)
*G11C 16/04* (2006.01)
(Continued)

(52) U.S. Cl.
CPC .......... *G11C 16/24* (2013.01); *G11C 16/0483* (2013.01); *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(58) Field of Classification Search
None
See application file for complete search history.

(56) References Cited

U.S. PATENT DOCUMENTS 7,515,483 B2 4/2009 Han
7,953,920 B2 5/2011 Yano et al.
(Continued)

FOREIGN PATENT DOCUMENTS

KR 10-2016-0000956 A 1/2016

OTHER PUBLICATIONS

European search report dated Dec. 3, 2021 corresponding to European Patent Application No. 21179837.6.

*Primary Examiner* — Tan T. Nguyen
(74) *Attorney, Agent, or Firm* — Harness, Dickey & Pierce, P.L.C.

(57) ABSTRACT

A nonvolatile memory device includes a memory cell array including memory cells and a page buffer circuit. The page buffer circuit includes page buffer units and cache latches. The cache latches are spaced apart from the page buffer units in a first horizontal direction, and correspond to respective ones of the plurality of page buffer units. Each of the page buffer units includes a pass transistor connected to each sensing node and driven in response to a pass control signal. The page buffer circuit being configured to perform a data transfer operation, based on performing a first data output operation to output data, provided from a first portion of page buffer units, from a first portion of cache latches to a data input/output (I/O) line, the data transfer operation configured to dump sensed data from a second portion of page buffer units to a second portion of cache latches.

20 Claims, 29 Drawing Sheets

(51) Int. Cl.
*H01L 23/00* (2006.01)
*H01L 25/065* (2023.01)
*H01L 25/18* (2023.01)

(56) References Cited

U.S. PATENT DOCUMENTS

| | | |
|---|---|---|
| 8,270,215 B2 | 9/2012 | You et al. |
| 9,032,108 B2 | 5/2015 | Lim |
| 9,368,166 B2 | 6/2016 | Kwak et al. |
| 9,606,730 B2 | 3/2017 | Jun et al. |
| 9,851,899 B2 | 12/2017 | You |
| 10,007,603 B2 | 6/2018 | Lee et al. |
| 2012/0203959 A1 | 8/2012 | Yoon et al. |
| 2015/0378887 A1 | 12/2015 | Lee et al. |
| 2016/0011779 A1 | 1/2016 | Lee |
| 2016/0322376 A1 | 11/2016 | Lee |
| 2019/0043872 A1 | 2/2019 | Oh et al. |
| 2019/0385674 A1 | 12/2019 | Cho et al. |
| 2020/0135282 A1 | 4/2020 | Ko et al. |
| 2020/0258577 A1 | 8/2020 | Lee et al. |
| 2020/0411108 A1* | 12/2020 | Lee .................. G11C 16/26 |

\* cited by examiner

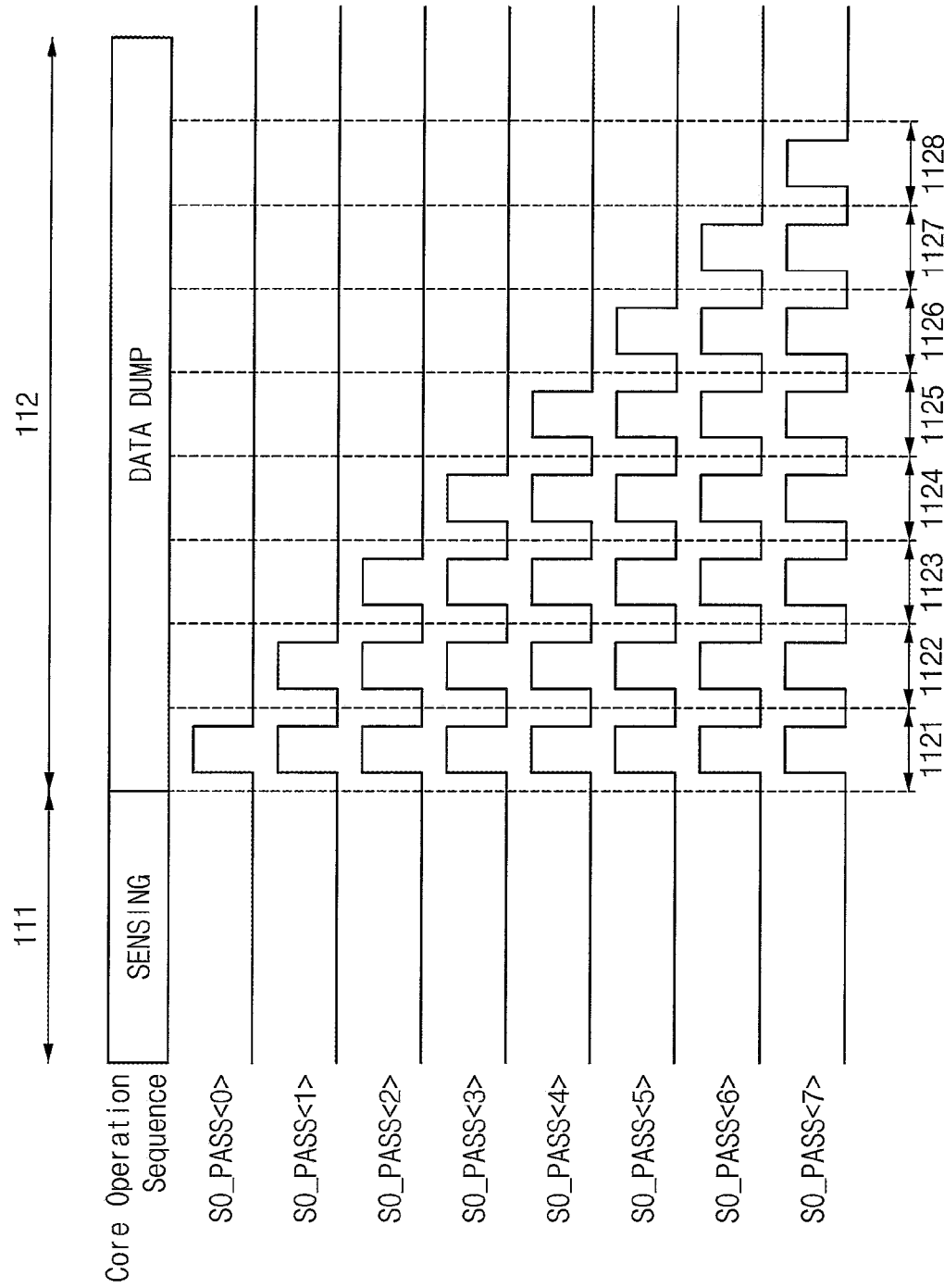

FIG. 24
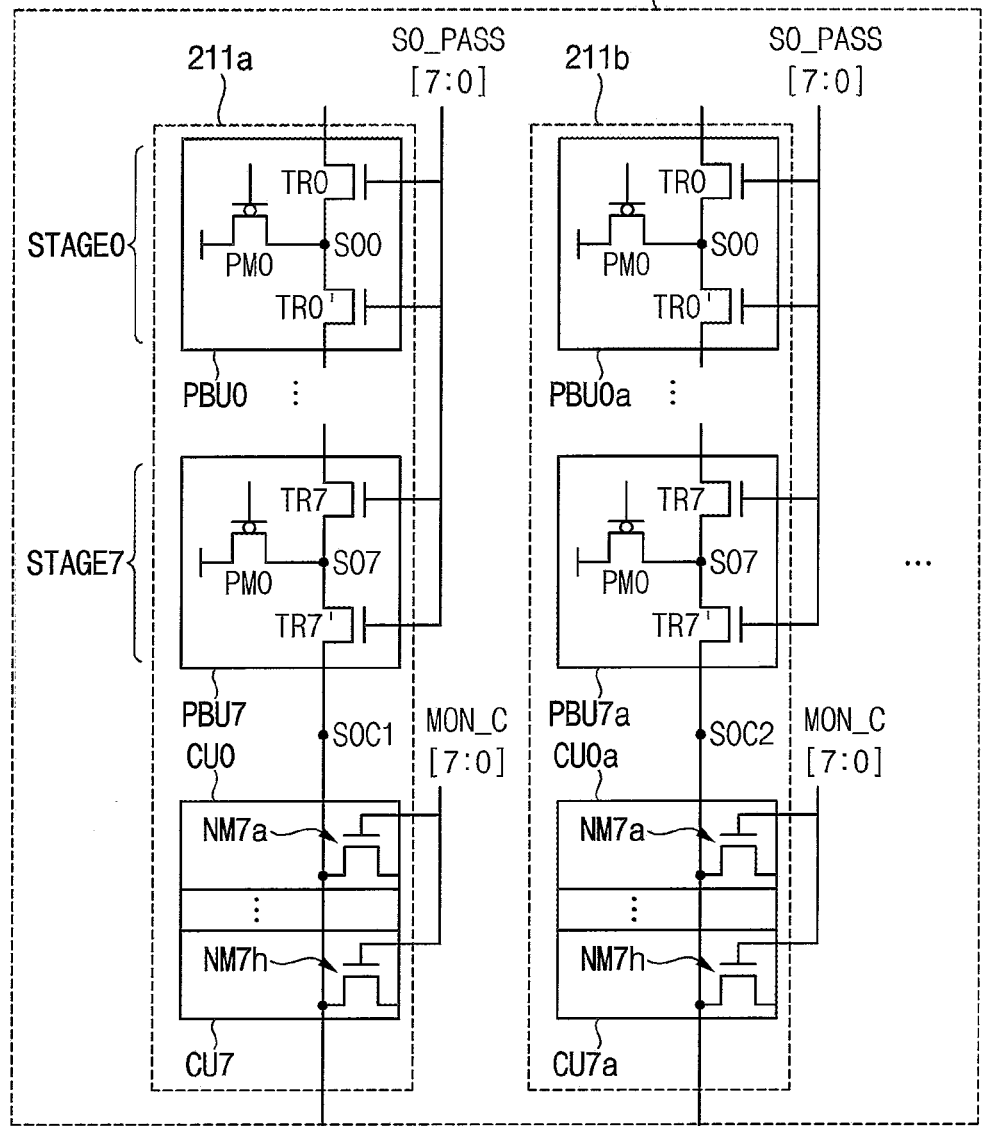
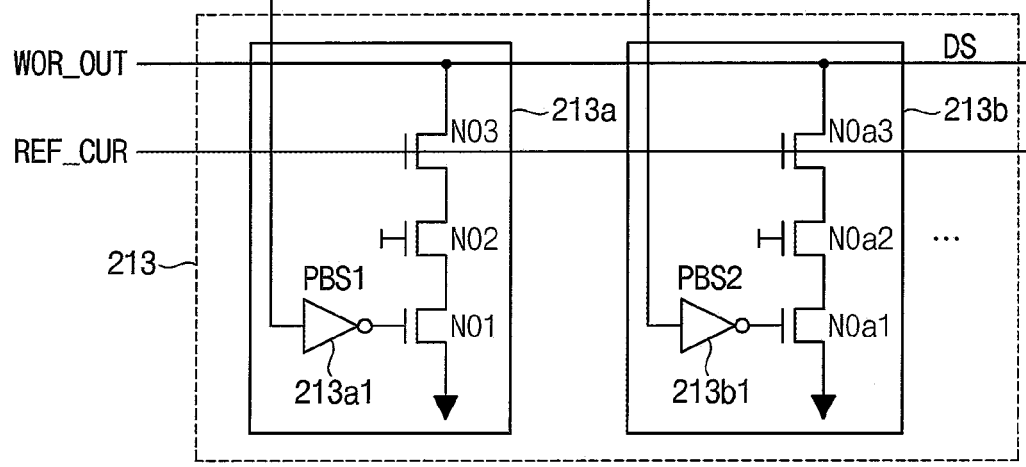

PAGE BUFFER CIRCUITS AND NONVOLATILE MEMORY DEVICES INCLUDING THE SAME

CROSS-REFERENCE TO RELATED APPLICATIONS

This US application claims the benefit of priority under 35 USC § 119 to Korean Patent Application No. 10-2020-0101529, filed on Aug. 13, 2020 and to Korean Patent Application No. 10-2020-0175022, filed on Dec. 15, 2020, in the Korean Intellectual Property Office, the disclosures of each of which are incorporated by reference in their entirety herein.

BACKGROUND

1. Technical Field

Example embodiments generally relate to semiconductor memory devices, and more particularly to page buffer circuits and nonvolatile memory devices including the same.

2. Discussion of the Related Art

Semiconductor memory devices for storing data may be classified into volatile memory devices and nonvolatile memory devices. Volatile memory devices, such as dynamic random access memory (DRAM) devices, are typically configured to store data by charging or discharging capacitors in memory cells, and lose the stored data when power is off. Nonvolatile memory devices, such as flash memory devices, may maintain stored data even though power is off. Volatile memory devices are widely used as main memories of various apparatuses, while nonvolatile memory devices are widely used for storing program codes and/or data in various electronic devices, such as computers, mobile devices, etc.

Recently, nonvolatile memory devices of three-dimensional structure such as a vertical NAND memory devices have been developed to increase integration degree and memory capacity of the nonvolatile memory devices. A nonvolatile memory device may include a page buffer circuit for storing data in or outputting data from memory cells, and the page buffer circuit may include semiconductor devices such as transistors. Due to demand for a reduction in a size of the page buffer circuit and development of process technology due to an increase in a degree of integration of the nonvolatile memory device, the size of the semiconductor device included in the page buffer circuit may be reduced, and accordingly, a layout of wirings connected to the semiconductor devices may become complicated.

SUMMARY

Some example embodiments may provide a nonvolatile memory device capable of enhancing efficiency of a programming operation.

Some example embodiments may provide a method of programming in a nonvolatile memory device, capable of enhancing efficiency of a programming operation.

According to some example embodiments, a nonvolatile memory device includes a memory cell array including a plurality of memory cells and a page buffer circuit. The page buffer circuit includes a plurality of page buffer units and a plurality of cache latches. The plurality of page buffer units are disposed in a first horizontal direction and are connected to each of the memory cells through a plurality of bit-lines. The plurality of cache latches are spaced apart from the plurality of page buffer units in the first horizontal direction, and the plurality of cache latches corresponding to respective ones of the plurality of page buffer units. Each of the plurality of page buffer units includes a pass transistor connected to each sensing node and driven in response to a pass control signal. The page buffer circuit being configured to perform a data transfer operation, based on performing a first data output operation to output data, provided from a first portion of page buffer units among the plurality of page buffer units, from a first portion of cache latches among the plurality of cache latches to a data input/output (I/O) line, the data transfer operation configured to dump sensed data from a second portion of page buffer units among the plurality of page buffer units to a second portion of cache latches among the plurality of cache latches.

According to some example embodiments, a nonvolatile memory device includes a memory cell array including a plurality of memory cells and a page buffer circuit. The page buffer circuit includes a plurality of page buffer units and a plurality of cache latches. The plurality of page buffer units in a first horizontal direction and are connected to each of the memory cells through a plurality of bit-lines. The plurality of cache latches are spaced apart from the plurality of page buffer units in the first horizontal direction, and the plurality of cache latches correspond to respective ones of the plurality of page buffer units. The plurality of cache latches are commonly connected to a data transmission line. Each of the plurality of page buffer units includes a pass transistor connected to each sensing node, connected to the data transmission line and driven in response to a pass control signal. While performing a first data output operation to output data, provided from a first portion of page buffer units among the plurality of page buffer units, from a first portion of cache latches among the plurality of cache latches to a data input/output (I/O) line, the page buffer circuit performs a data transfer operation to dump sensed data from a second portion of page buffer units among the plurality of page buffer units to a second portion of cache latches among the plurality of cache latches.

According to some example embodiments, a nonvolatile memory device includes a first semiconductor layer and a second semiconductor layer. The first semiconductor layer includes a plurality of memory cells connected to each of a plurality of bit-lines extending in a first horizontal direction. The second semiconductor layer being in a vertical direction to the first semiconductor layer and including a page buffer circuit. The page buffer circuit includes a main region and a cache region. The main region includes a plurality of page buffer units in the first horizontal direction. The cache region is adjacent to the main region in the first horizontal direction, and includes a plurality of cache latches disposed in the first horizontal direction and commonly connected to a combined sensing node. The plurality of cache latches respectively correspond to respective ones of the plurality of page buffer units. Each of the plurality of page buffer units includes a pass transistor connected to each sensing node and driven in response to a pass control signal. While performing a first data output operation to output data, provided from a first portion of page buffer units among the plurality of page buffer units, from a first portion of cache latches among the plurality of cache latches to a data input/output (I/O) line, the page buffer circuit performs a data transfer operation to dump sensed data from a second portion of page buffer units among the plurality of page buffer units to a second portion of cache latches among the plurality of cache latches.

According to some example embodiments, a page buffer circuit includes a plurality of page buffer units and a plurality of cache latches. The plurality of cache latches are commonly connected to the plurality of page buffer units via a combined sensing node, and the plurality of cache latches correspond to respective ones of the plurality of page buffer units. Each of the plurality of page buffer units includes a pair of pass transistors and a sensing node to connect the pair of pass transistors to each other. In a data transfer period, between the plurality of page buffer units and the plurality of cache latches, sensing node lines included in each of the plurality of page buffer units are connected to the combined sensing node, and the plurality of page buffer units are electrically connected to the plurality of cache latches. While the page buffer circuit performs a first data output operation to output data provided from a first portion of page buffer units among the plurality of page buffer units, from a first portion of cache latches among the plurality of cache latches to a data input/output (I/O) line, the page buffer circuit is configured to perform a data transfer operation to dump sensed data from a second portion of page buffer units among the plurality of page buffer units to a second portion of cache latches among the plurality of cache latches.

According to some example embodiments, a nonvolatile memory device includes a memory cell region and a peripheral circuit region. The memory cell region includes a plurality of memory cells and a first metal pad. The peripheral circuit region includes a second metal pad, and the peripheral circuit region is vertically connected to the memory cell region the first metal pad and the second metal pad. The peripheral circuit region includes a page buffer circuit including a plurality of page buffer units and a plurality of cache latches. The plurality of page buffer units are in a first horizontal direction and are connected to each of the memory cells through a plurality of bit-lines. The plurality of cache latches are spaced apart from the plurality of page buffer units in the first horizontal direction and are commonly connected to a combined sensing node. The plurality of cache latches correspond to respective ones of the plurality of page buffer units. Each of the plurality of page buffer units includes a pass transistor connected to each sensing node and driven based on a pass control signal. While performing a first data output operation to output data provided from a first portion of page buffer units among the plurality of page buffer units, from a first portion of cache latches among the plurality of cache latches to a data input/output (I/O) line, the page buffer circuit performs a data transfer operation to dump sensed data from a second portion of page buffer units among the plurality of page buffer units to a second portion of cache latches among the plurality of cache latches.

Accordingly, the page buffer circuit in the nonvolatile memory device includes a plurality of page buffer units and a plurality of cache latches. The plurality of cache latches are commonly connected to the plurality of page buffer units via a combined sensing node. While the page buffer circuit performs a first data output operation to output data provided from a first portion of page buffer units among the plurality of page buffer units, from a first portion of cache latches among the plurality of cache latches to a data input/output (I/O) line, the page buffer circuit is configured to perform a data transfer operation to dump sensed data from a second portion of page buffer units among the plurality of page buffer units to a second portion of cache latches among the plurality of cache latches. Therefore, the nonvolatile memory device may reduce an interval associated with read operation.

BRIEF DESCRIPTION OF THE DRAWINGS

Illustrative, non-limiting example embodiments will be more clearly understood from the following detailed description in conjunction with the accompanying drawings.

FIG. 11 is a timing diagram of voltage levels of a plurality of pass control signals according to a core operation sequence, according to example embodiments.

FIG. 24 illustrates a page buffer circuit and the PBDEC according to example embodiments.

DETAILED DESCRIPTION OF THE EMBODIMENTS

Various example embodiments will be described more fully hereinafter with reference to the accompanying drawings, in which some example embodiments are shown.

Figure 1:
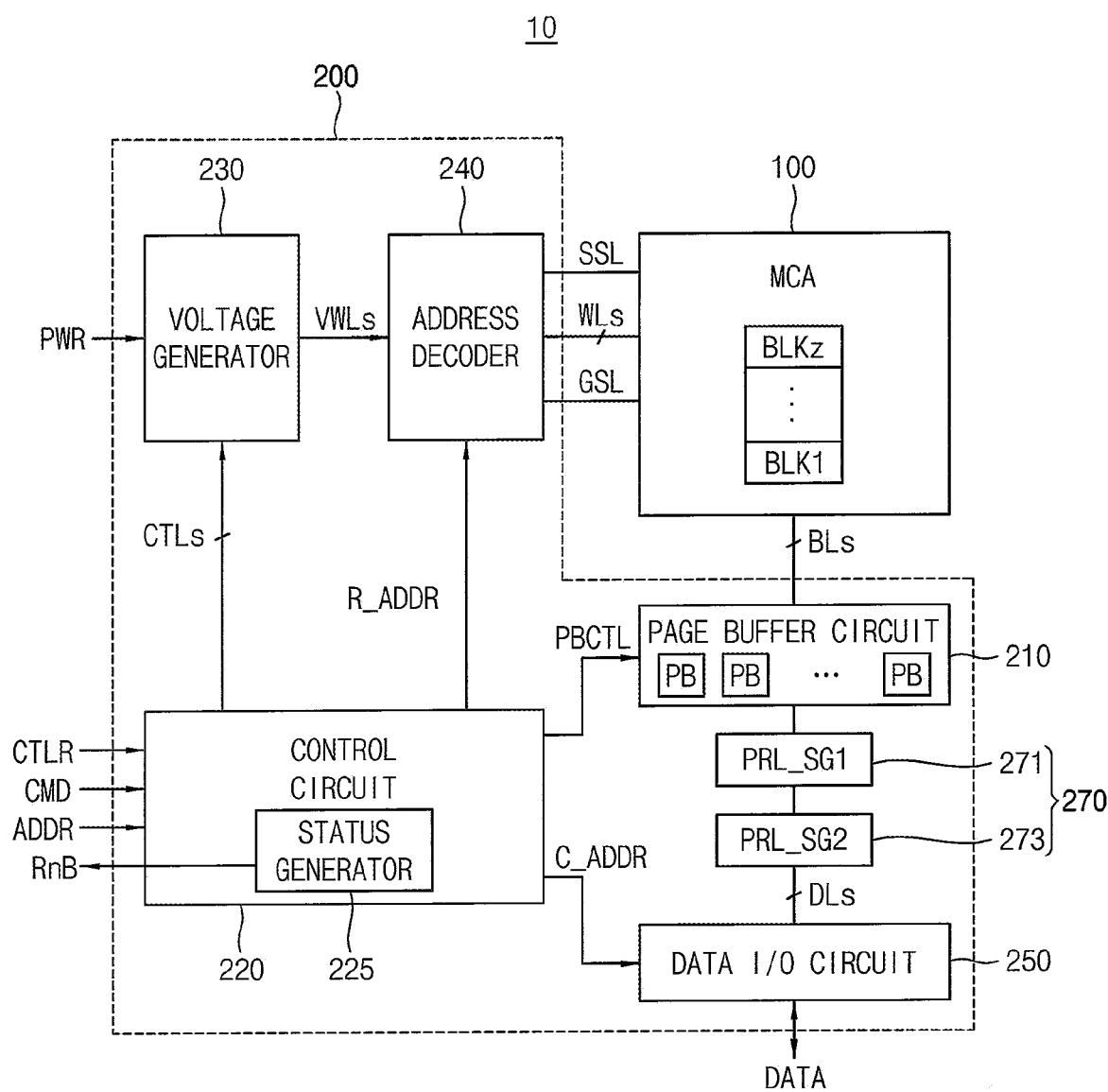
FIG. 1 is a block diagram of a nonvolatile memory device according to example embodiments.
Figure 2:
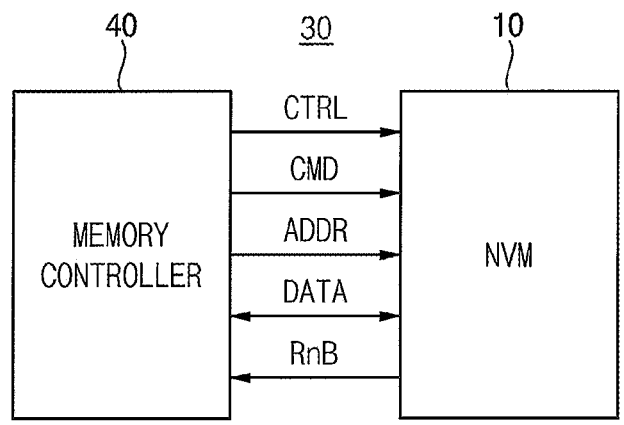
FIG. 2 is a block diagram illustrating a memory system including the nonvolatile memory device according to example embodiments.

It will be understood that some or all of any of the devices, controllers, generators, decoders, units, modules, or the like according to any of the example embodiments as described herein, including some or all of any of the elements of the peripheral circuit 200 shown in FIG. 1, the storage device 100 shown in FIG. 1, memory controller 40 shown in FIG. 2, any combination thereof, or the like may be included in, may include, and/or may be implemented by one or more instances of processing circuitry such as hardware including logic circuits, a hardware/software combination such as a processor executing software; or a combination thereof. In some example embodiments, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, any of the memories, memory units, or the like as described herein may include a non-transitory computer readable storage device, for example a solid state drive (SSD), storing a program of instructions, and the one or more instances of processing circuitry may be configured to execute the program of instructions to implement the functionality of some or all of any of the devices, controllers, decoders, units, modules, or the like according to any of the example embodiments as described herein, including any of the methods of operating any of same as described herein.

FIG. 1 is a block diagram of a nonvolatile memory device according to example embodiments.

Referring to FIG. 1, a nonvolatile memory device 10 may include a memory cell array 100 and a peripheral circuit 200. The peripheral circuit 200 may include a page buffer circuit 210, a control circuit 220, a voltage generator 230, an address decoder 240 (e.g., address decoder circuit), and a data input/output (I/O) circuit 250. Although not illustrated in FIG. 1, the peripheral circuit 200 may further include an I/O interface, a column logic, a pre-decoder, a temperature sensor, a command decoder, etc.

The memory cell array 100 may be coupled to the address decoder 240 through a string selection line SSL, a plurality of word-lines WLs, and a ground selection line GSL. Alternatively or additionally, the memory cell array 100 may be coupled to the page buffer circuit 210 through a plurality of bit-lines BLs. The memory cell array 100 may include a plurality of nonvolatile memory cells coupled to the plurality of word-lines WLs and the plurality of bit-lines BLs.

The memory cell array 100 may include a plurality of memory blocks BLK1 through BLKz, and each of the memory blocks BLK1 through BLKz (z being any positive integer) may have a three-dimensional (3D) structure. The memory cell array 100 may include a plurality of vertical cell strings and each of the vertical cell strings includes a plurality of memory cells stacked with respect to each other.

The control circuit 220 may, receive a command CMD, an address ADDR, and a control signal CTRL from a memory controller and may control an erase loop, a program loop and a read operation of the nonvolatile memory device 10. The program loop may include a program operation and a program verification operation and the erase loop may include an erase operation and an erase verification operation.

In some example embodiments, the control circuit 220 may generate control signals CTLs, which are used for controlling the voltage generator 230, based on the command CMD, may generate a page buffer control signal PBCTL for controlling the page buffer circuit 210 and generate a row address R_ADDR and a column address C_ADDR based on the address ADDR. The control circuit 220 may provide the control signals CTLs to the voltage generator 230 and may provide the page buffer control signal PBCTL to the page buffer circuit 210. Alternatively or additionally, the control circuit 220 may provide the row address R_ADDR to the address decoder 240 and provide the column address C_ADDR to the data I/O circuit 250. The control circuit 220 may include a status generator 225 and the status generator 225 may generate a status signal RnB indicating an operating status of the nonvolatile memory device 10. The status signal RnB may be referred to as a ready/busy signal because of the status signal RnB indicates either busy state or a ready state of the nonvolatile memory device 10.

The address decoder 240 may be coupled to the memory cell array 100 through the string selection line SSL, the plurality of word-lines WLs, and the ground selection line GSL. During program operation or read operation, the address decoder 240 may determine one of the plurality of word-lines WLs as a selected word-line based on the row address R_ADDR and may determine rest of the plurality of word-lines WLs except the selected word-line as unselected word-lines.

The voltage generator 230 may generate word-line voltages VWLs associated with operations of the nonvolatile memory device 10 using a power PWR provided from the memory controller based on control signals CTLs from the control circuit 220. The word-line voltages VWLs may include a program voltage, a read voltage, a pass voltage, an erase verification voltage, or a program verification voltage. The word-line voltages VWLs may be applied to the plurality of word-lines WLs through the address decoder 240.

In some example embodiments, during the erase operation, the voltage generator 230 may apply erase voltage to a well of a selected memory block and may apply a ground voltage to all word-lines of the selected memory block. During the erase verification operation, the voltage generator 230 may apply erase verification voltage to all word-lines of the selected memory block or may apply the erase verification voltage to the word-lines of the selected memory block by word-line basis.

In some example embodiments, during the program operation, the voltage generator 230 may apply a program voltage to the selected word-line and may apply a program pass voltage to the unselected word-lines. Alternatively or additionally, during the program verification operation, the voltage generator 230 may apply a program verification voltage to the selected word-line and may apply a verification pass voltage to the unselected word-lines. Alternatively or additionally, during the read operation, the voltage generator 230 may apply a read voltage to the selected word-line and may apply a read pass voltage to the unselected word-lines.

The page buffer circuit 210 may be coupled to the memory cell array 100 through the plurality of bit-lines BLs. The page buffer circuit1 410 may include a plurality of page buffers PB. The page buffer circuit 210 may store, e.g. temporarily store data to be programmed in a selected page or data read out from the selected page of the memory cell array 100.

Figure 5:
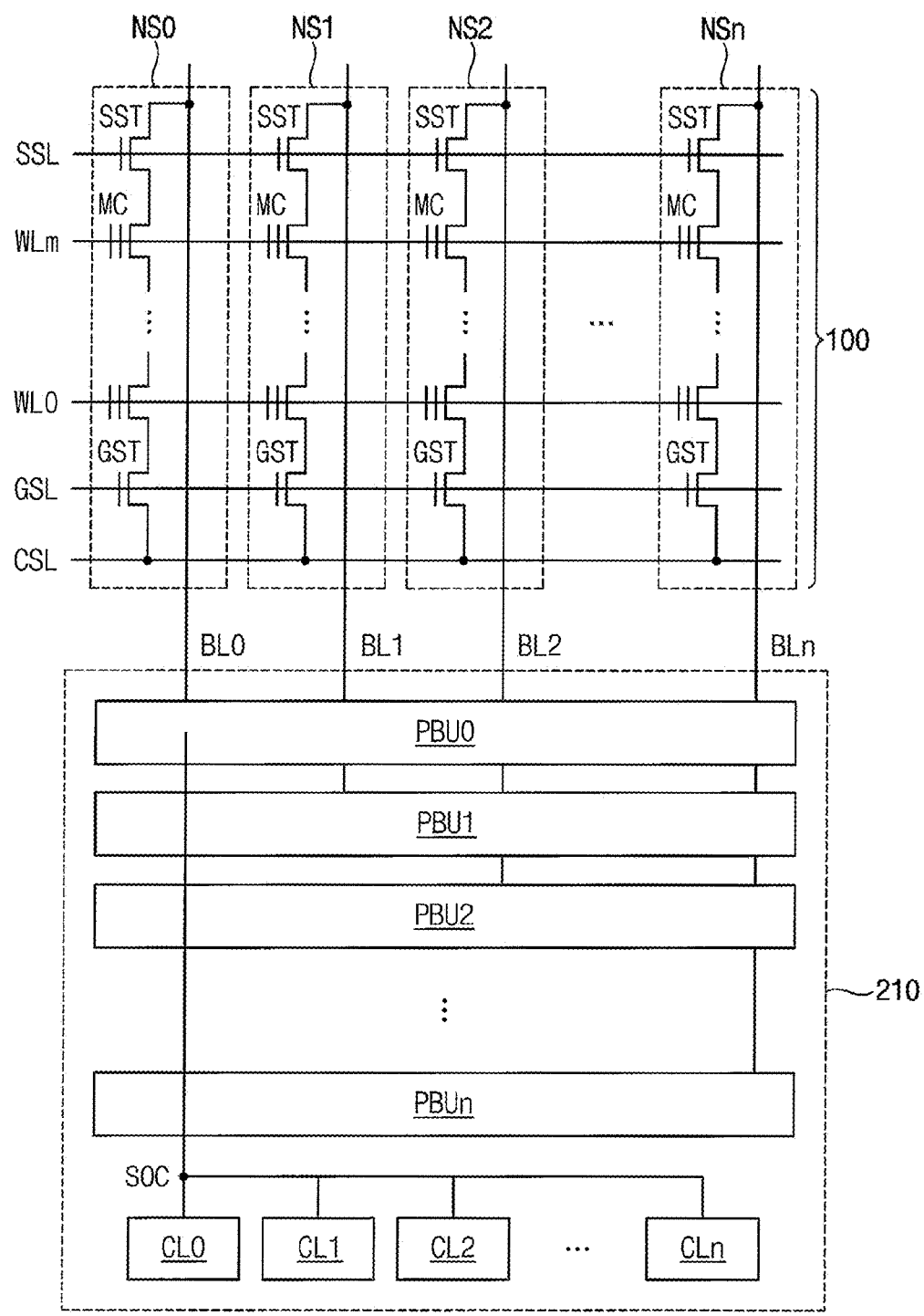
FIG. 5 is a schematic diagram of a connection of the memory cell array to the page buffer circuit in FIG. 1, according to example embodiments.

In some example embodiments, page buffer units included in each of the plurality of page buffers PB (for example, first through (n+1)th page buffer units PBU0 through PBUn in FIG. 5) and cache latches included in each of the plurality of page buffers PB (for example, first through (n+1)th cache latches CL0 through CLn in FIG. 5) may be apart from each other, and have separate structures. Accordingly, the degree of freedom of wirings on the page buffer units may be improved, and the complexity of a layout may be reduced. Alternatively or additionally, because the cache latches are adjacent to the data I/O lines, the distance between the cache latches and the data I/O lines may be reduced, and thus, data I/O speed may be improved.

Alternatively or additionally, while the page buffer circuit 210 performs a first data output operation to output data, provided from a portion of page buffer units among the plurality of page buffer units, from a first portion of cache latches among the plurality of cache latches to a data I/O line, the page buffer circuit 210 may perform a data transfer operation to dump sensed data from a second portion of page buffer units among the plurality of page buffer units to a second portion of cache latches among the plurality of cache latches. That is, the page buffer circuit 210 performs the first data output operation and the data transfer operation substantially simultaneously. Therefore, a read time of the nonvolatile memory device 10 may be reduced.

The page buffer circuit 210 may further include a register 270 disposed between the page buffer circuit 210 and the data I/O circuit 250. The register 270 may temporarily store data output from the cache latches. The page buffer circuit 210 may include a first register segment (PRL_SG1) 271 and a second register segment (PRL_SG2) 273 which are distributed between the page buffer circuit 210 and the data I/O circuit 250. A number of register segments distributed between the page buffer circuit 210 and the data I/O circuit 250 may be varied based on a distance between the page buffer circuit 210 and the data I/O circuit 250.

In some example embodiments, the first data output operation may be performed by sequentially moving data to the register 270 based on the column address C_ADDR which is selected for data output operation and outputting data through the data I/O circuit 250. Moving the data to be outputted from cache latches to the register 270 is completed before the status signal RnB transitions to a ready state for reducing latency of the data output operation when the data output operation is performed after the status signal RnB transitions to the ready state.

The data I/O circuit 250 may be coupled to the register 270 through data lines DLs. During the program operation, the data I/O circuit 420 may receive program data DATA from the memory controller (400 in FIG. 2) and provide the program data DATA to the page buffer circuit 410 based on the column address C_ADDR received from the control circuit 210. During the read operation, the data I/O circuit 250 may provide read data DATA to the memory controller 40 based on the column address C_ADDR received from the control circuit 250.

The data lines DLs may be referred to as data I/O lines and the data I/O circuit 250 may include I/O pads connected to the data I/O lines.

Figure 9:
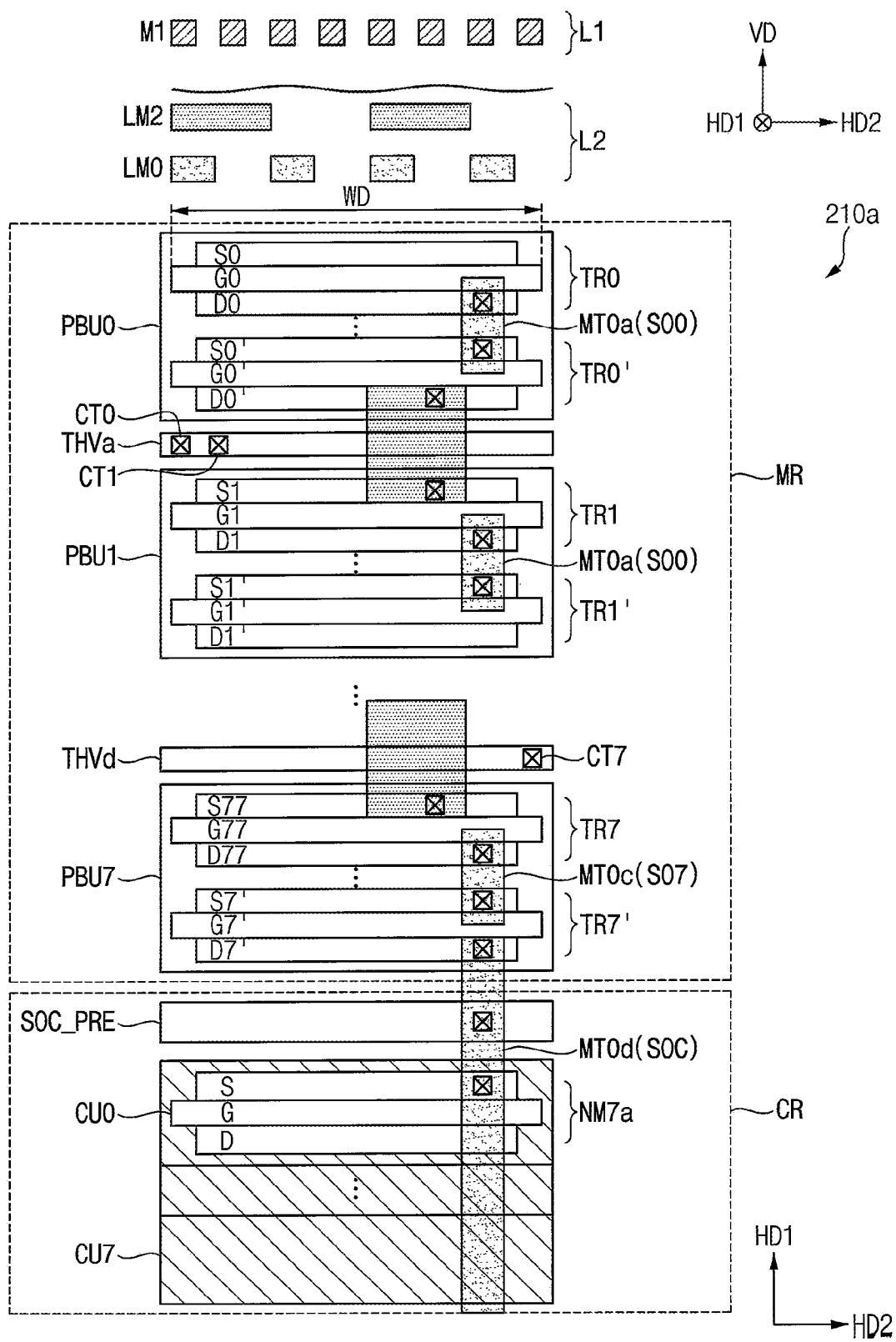
FIG. 9 is a plan view of a page buffer circuit according to example embodiments.

In some example embodiments, each page buffer unit may include a pair of pass transistors (for example, TR0 and TR0' in FIG. 9), and a sensing node line for connecting the pair of pass transistors to each other (for example, MT0a in FIG. 9). In some example embodiments, the sensing node line may be implemented as one track of a lower metal layer (for example, LM0 in FIG. 9), and may correspond to the sensing node. In a data sensing period, the pass transistors included in each of the plurality of page buffer units may not be electrically connected to each other, and accordingly, the sensing node lines included in each of the plurality of page buffer units may not be electrically connected to each other. On the other hand, in a data transfer period, the pass transistors included in each of the plurality of page buffer units may be connected to each other in series, and accordingly, the sensing node lines included in each of the plurality of page buffer units may be electrically connected to each other and be used as data transfer lines. Accordingly, because the page buffer circuit 210 does not need to separately include the plurality of data transfer lines for connecting the plurality of page buffer units to respective ones of the plurality of cache latches, an area of a region occupied by the page buffer circuit 210 may be reduced.

Although each of the page buffer circuit 210, the control circuit 220, the voltage generator 230, the address decoder 240 (e.g., address decoder circuit), and the data input/output (I/O) circuit 250 are illustrated as being distinct, example embodiments are not limited thereto, and some of the functions of one of the page buffer circuit 210, the control circuit 220, the voltage generator 230, the address decoder 240 (e.g., address decoder circuit), and the data input/output (I/O) circuit 250 may be performed by others of the page buffer circuit 210, the control circuit 220, the voltage generator 230, the address decoder 240 (e.g., address decoder circuit), and the data input/output (I/O) circuit 250. This may also be the case of additional elements within the peripheral circuit 200 as described in example embodiments herein.

FIG. 2 is a block diagram illustrating a memory system including the nonvolatile memory device according to example embodiments.

Referring to FIG. 2, a memory system 30 may include a memory controller 40 and the nonvolatile memory device 10.

The memory controller 40 may control operation of the nonvolatile memory device 10 by applying control signal CTRL, the command CMD and address ADDR to the nonvolatile memory device 10 may exchange the data DATA with the nonvolatile memory device 10. The nonvolatile memory device 10 may provide the status signal RnB indicating operating status of the nonvolatile memory device 10. In some example embodiments, when the status signal RnB has a logic high level (ready state), the status signal RnB indicates that the nonvolatile memory device 10 is ready for receiving a command from the memory controller 40.

Figure 3:
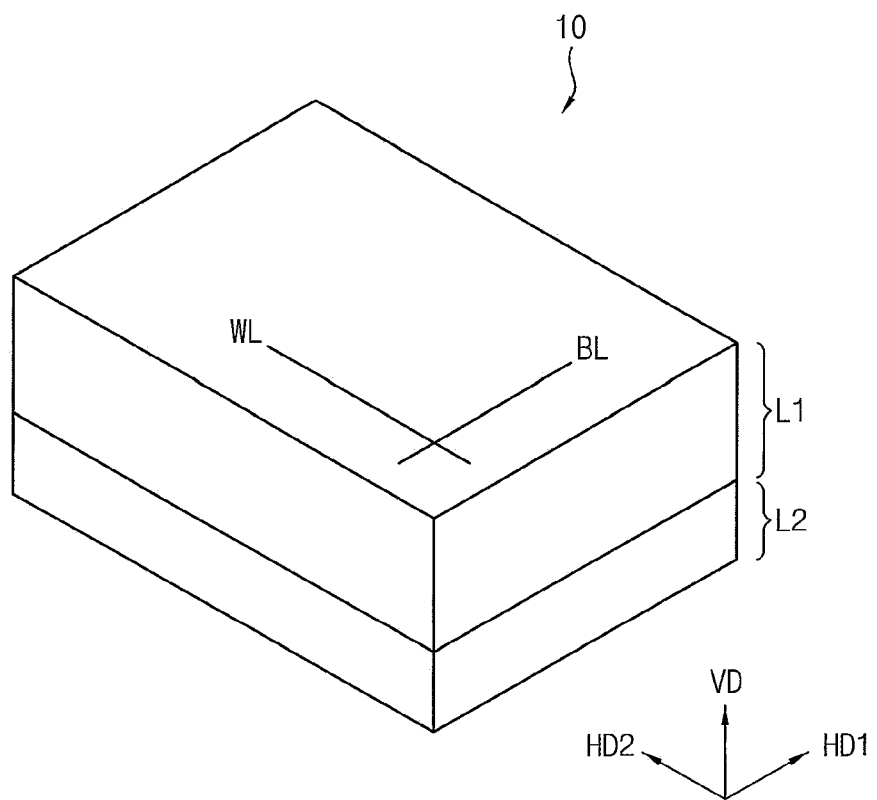
FIG. 3 schematically illustrates a structure of the nonvolatile memory device of FIG. 1 according to example embodiments.

FIG. 3 schematically illustrates a structure of the nonvolatile memory device of FIG. 1 according to example embodiments.

Referring to FIG. 3, the memory device 10 may include a first semiconductor layer L1 and a second semiconductor layer L2, and the first semiconductor layer L1 may be stacked in a vertical direction VD with respect to the second semiconductor layer L2. The second semiconductor layer L2 may be under the first semiconductor layer L1 in the vertical direction VD, and accordingly, the second semiconductor layer L2 may be close to a substrate.

In some example embodiments, the memory cell array 100 in FIG. 1 may be formed (or, provided) on the first semiconductor layer L1, and the peripheral circuit 200 in FIG. 1 may be formed (or, provided) on the second semiconductor layer L2. Accordingly, the memory device 10 may have a structure in which the memory cell array 100 is on the peripheral circuit 200, that is, a cell over periphery (COP) structure. The COP structure may effectively reduce an area in a horizontal direction and improve the degree of integration of the memory device 10.

In some example embodiments, the second semiconductor layer L2 may include the substrate, and by forming transistors on the substrate and metal patterns for wiring transistors (for example, first and third lower metal layers LM0 and LM2 in FIG. 9), the peripheral circuit 200 may be formed in the second semiconductor layer L2. After the peripheral circuit 200 is formed on the second semiconductor layer L2, the first semiconductor layer L1 including the memory cell array 100 may be formed, and the metal patterns for connecting the word-lines WL and the bit-lines BL of the memory cell array 100 to the peripheral circuit 200 formed in the second semiconductor layer L2 may be formed. In some example embodiments, the bit-lines BL may extend in a first horizontal direction HD1, and the word-lines WL may extend in a second horizontal direction HD2.

As the number of stages of memory cells in the memory cell array 100 increases with the development of semiconductor processes, that is, as the number of stacked word-lines WL increases, an area of the memory cell array 100 may decrease, and accordingly, an area of the peripheral circuit 200 may also be reduced. According to some example embodiments, to reduce an area of a region occupied by the page buffer circuit 210, the page buffer circuit 210 may have a structure in which the page buffer unit and the cache latch are separated from each other, and may connect sensing nodes included in each of the page buffer units commonly to a combined sensing node. This will be explained in detail with reference to FIG. 9.

Figure 4A:
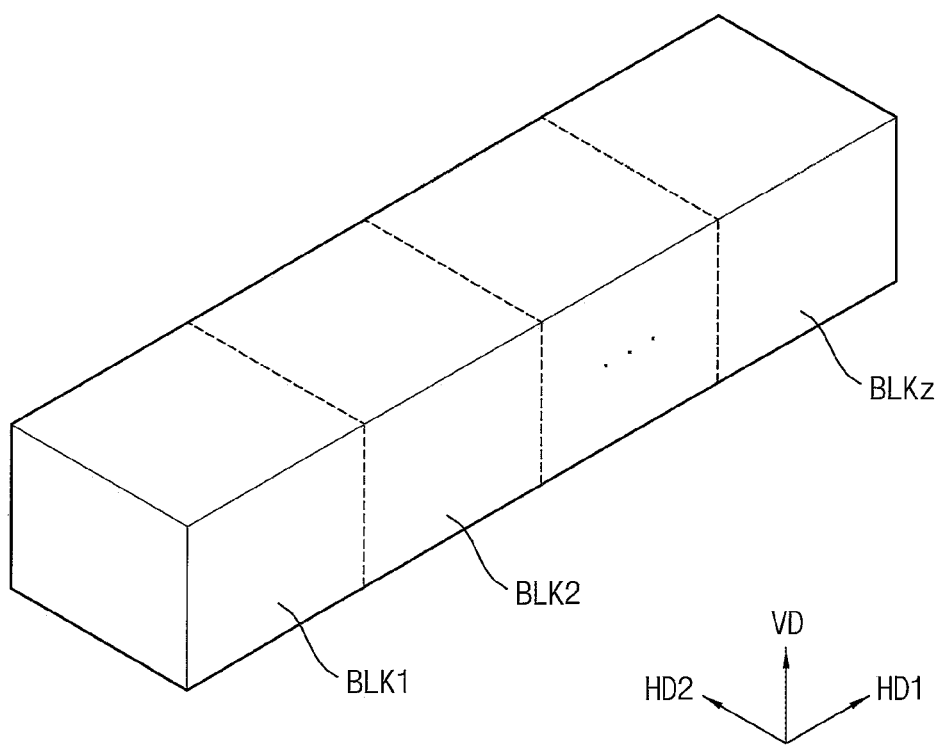
FIG. 4A is a block diagram illustrating an example of the memory cell array in FIG. 1 according to example embodiments.

FIG. 4A is a block diagram illustrating an example of the memory cell array in FIG. 1 according to example embodiments.

Referring to FIG. 4A, the memory cell array 100 may include a plurality of memory blocks BLK1 to BLKz which extend along a plurality of directions HD1, HD2 and VD. In some example embodiments, the memory blocks BLK1 to BLKz are selected by the address decoder 240 in FIG. 1. In some example embodiments, the address decoder 240 may select a memory block BLK corresponding to a block address among the memory blocks BLK1 to BLKz.

Figure 4B:
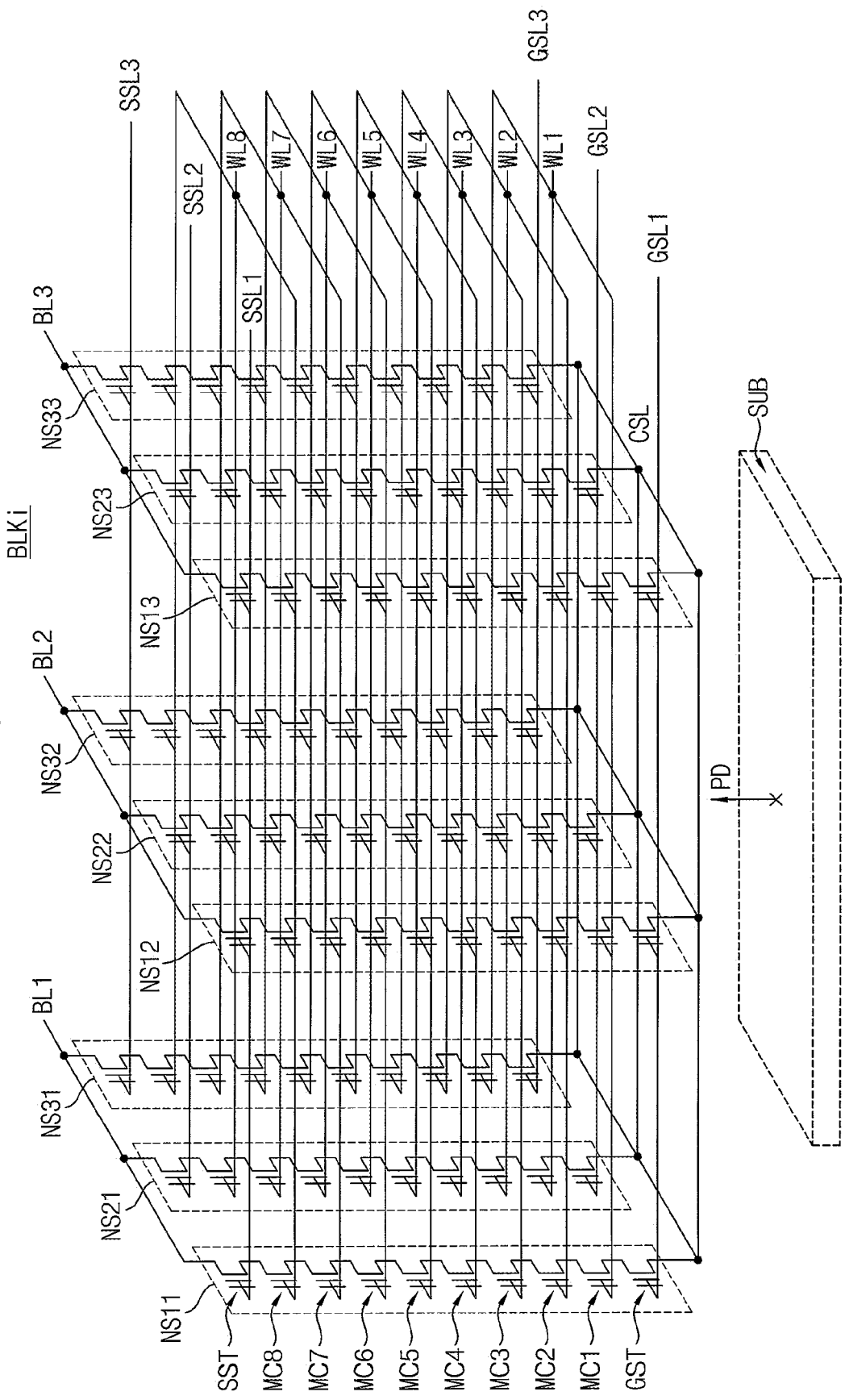
FIG. 4B is a circuit diagram illustrating one of the memory blocks of FIG. 4A.

FIG. 4B is a circuit diagram illustrating one of the memory blocks of FIG. 4A.

The memory block BLKi of FIG. 4B may be formed on a substrate SUB in a three-dimensional structure (or a vertical structure). In some example embodiments, a plurality of memory cell strings included in the memory block BLKi may be formed in a direction PD perpendicular to the substrate SUB.

Figure 8:
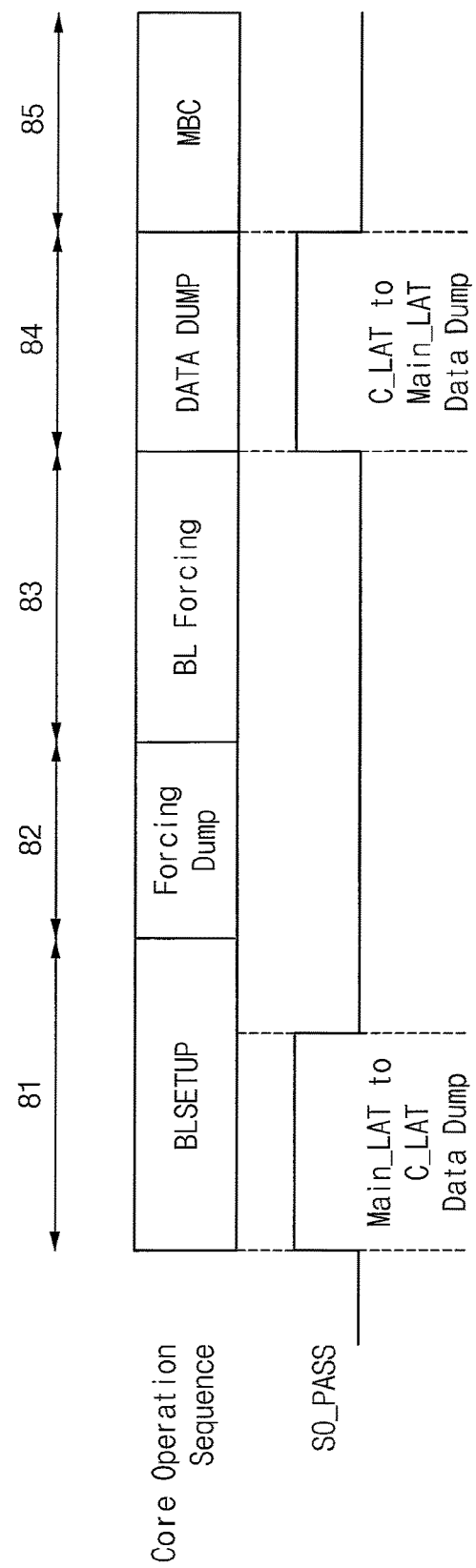
FIG. 8 is a timing diagram of another example of a voltage level of the pass control signal according to a core operation sequence, according to example embodiments.

Referring to FIG. 4B, the memory block BLKi may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 8, each of the memory cell strings NS11 to NS33 is illustrated to include eight memory cells MC1 to MC8. However, inventive concepts are not limited thereto. In some example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) at the same height, e.g. at the same position relative to a surface of the substrate, may be commonly connected, and the ground selection lines GSL1 to GSL3 and the string selection lines SSL1 to SSL3 may be separated/electrically separated.

Figure 4C:
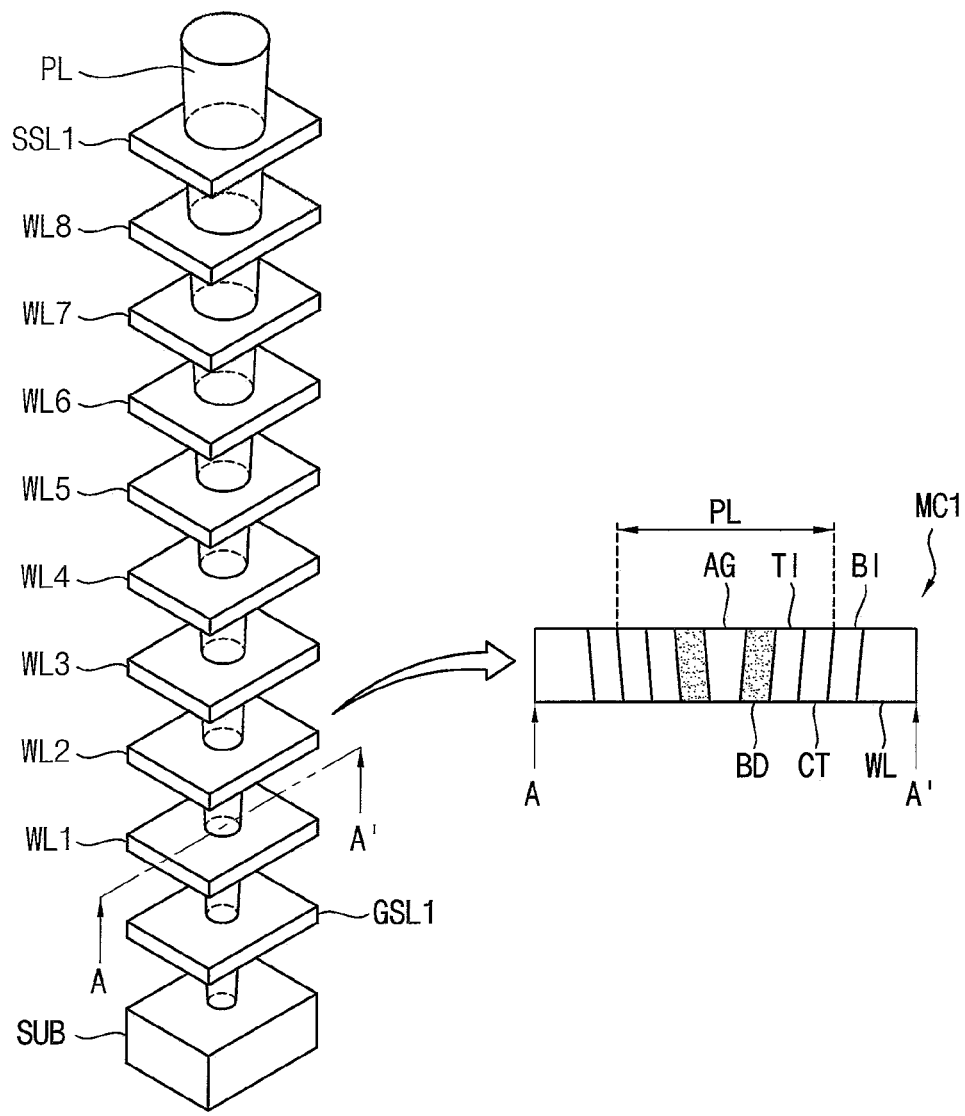
FIG. 4C illustrates an example of a structure of a cell string CS in the memory block of FIG. 4B.

FIG. 4C illustrates an example of a structure of a cell string CS in the memory block of FIG. 4B.

Referring to FIGS. 4B and 4C a pillar PL is provided on the substrate SUB such that the pillar PL extends in a direction perpendicular to the substrate SUB to make contact with the substrate SUB. Each of the ground selection line GSL, the word-lines WL1 to WL8, and the string selection lines SSL illustrated in FIG. 4C may be formed of a conductive material parallel with the substrate SUB, in some example embodiments, a metallic material. The pillar PL may be in contact with the substrate SUB through the conductive materials forming the string selection lines SSL, the word-lines WL1 to WL8, and the ground selection line GSL.

A sectional view taken along a line A-A' is also illustrated in FIG. 4C. In some example embodiments, a sectional view of a first memory cell MC1 corresponding to a first word-line WL1 is illustrated. The pillar PL may include a cylindrical body BD and may be tapered. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word-line WL1 and the pillar PL. The body BD, the tunnel insulating layer TI, the charge trap layer CT, the blocking insulating layer BI, and the first word-line WL1 may constitute or be included in a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

FIG. 5 is a schematic diagram of a connection of the memory cell array to the page buffer circuit in FIG. 1, according to example embodiments.

Referring to FIG. 5, the memory cell array 100 may include first through (n+1)th NAND strings NS0 through NSn, each of the first through (n+1)th NAND strings NS0 through NSn may include a ground select transistor GST connected to the ground select line GSL, a plurality of memory cells MC connected to respective ones of the first through (m+1)th word-lines WL0 through WLm, and a string select transistor SST connected to the string select line SSL, and the ground select transistor GST, the plurality of memory cells MC, and the string select transistor SST may be connected to each other in series. In other words, the plurality of memory cells MC may be connective to a respective first through (m+1)th word-lines WL0 through WLm. In some example embodiments, m may be a positive integer.

The page buffer circuit 210 may include first through (n+1)th page buffer units PBU0 through PBUn. The first page buffer unit PB0 may be connected to the first NAND string NS0 via the first bit-line BL0, and the (n+1)th page buffer unit PBUn may be connected to the (n+1)th NAND string NSn via the (n+1)th bit-line BLn. In some example embodiments, n may be a positive integer. In some example embodiments, n may be 7, and the page buffer circuit 210 may have a structure in which page buffer units of eight stages, or, the first through (n+1)th page buffer units PBU0 through PBUn are in a line. In some example embodiments, the first through (n+1)th page buffer units PBU0 through PBUn may be in a row in an extension direction of the first through (n+1)th bit-lines BL0 through BLn.

The page buffer circuit 210 may further include first through (n+1)th cache latches CL0 through CLn respectively corresponding to the first through (n+1)th page buffer units PBU0 through PBUn. That is, the first through (n+1)th cache latches CL0 through CLn may correspond to a respective one of the first through (n+1)th page buffer units PBU0 through PBUn. In some example embodiments, the page buffer circuit 210 may have a structure in which the cache latches of eight stages or the first through (n+1)th cache latches CL0 through CLn in a line. In some example embodiments, the first through (n+1)th cache latches CL0 through CLn may be in a row in an extension direction of the first through (n+1)th bit-lines BL0 through BLn.

The sensing nodes of each of the first through (n+1)th page buffer units PBU0 through PBUn may be commonly connected to a combined sensing node SOC. Alternatively or additionally, the first through (n+1)th cache latches CL0 through CLn may be commonly connected to the combined sensing node SOC. Accordingly, the first through (n+1)th page buffer units PBU0 through PBUn may be connected to the first through (n+1)th cache latches CL0 through CLn via the combined sensing node SOC.

Figure 6:
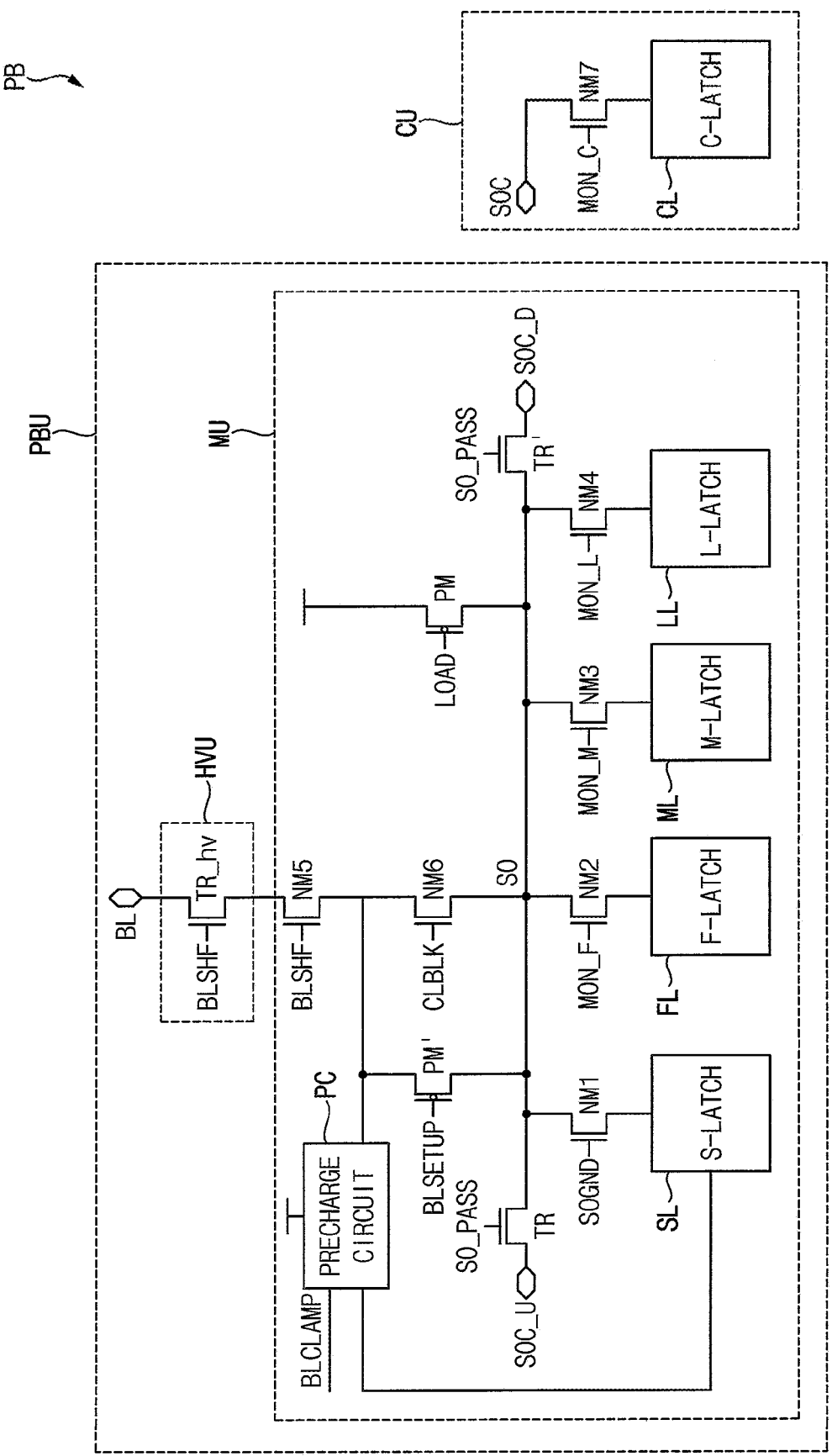
FIG. 6 illustrates in detail a page buffer according to example embodiments.

FIG. 6 illustrates in detail a page buffer according to example embodiments.

Referring to FIG. 6, the page buffer PB may correspond to an example of the page buffer PB in FIG. 1. The page buffer PB may include a page buffer unit PBU and a cache unit CU. Because the cache unit CU includes a cache latch (C-LATCH) CL, and the C-LATCH CL is connected to a data input/output line (not shown), the cache unit CU may be adjacent to the data input/output line. Accordingly, the page buffer unit PBU and the cache unit CU may be apart from each other, and the page buffer PB may have a structure in which the page buffer unit PBU and the cache unit CU are apart from each other.

The page buffer unit PBU may include a main unit MU. The main unit MU may include main transistors in the page buffer PB. The page buffer unit PBU may further include a bit-line selection transistor TR_hv that is connected to the bit-line BL and driven by a bit-line selection signal BLSLT. The bit-line select transistor TR_hv may include a high voltage transistor, and accordingly, the bit-line selection transistor TR_hv may be in a different well region from the main unit MU, that is, in a high voltage unit HVU.

The main unit MU may include a sensing latch (S-LATCH) SL, a force latch (F-LATCH) FL, an upper bit latch (M-LATCH) ML and a lower bit latch (L-LATCH) LL. According to some example embodiments, the S-LATCH SL, the F-LATCH FL, the M-LATCH ML, or the L-LATCH LL may be referred to as main latches. The main unit MU may further include a precharge circuit PC capable of controlling a precharge operation on the bit-line BL or a sensing node SO based on a bit-line clamping control signal BLCLAMP, and may further include a transistor PM' driven by a bit-line setup signal BLSETUP.

The S-LATCH SL may, during a read or program verification operation, store data stored in a memory cell MC or a sensing result of a threshold voltage of the memory cell MC. Alternatively or additionally, the S-LATCH SL may, during a program operation, be used to apply a program bit-line voltage or a program inhibit voltage to the bit-line BL. The F-LATCH FL may be used to improve threshold voltage distribution during the program operation. The F-LATCH FL may store force data. After the force data is initially set to '1', the force data may be converted to '0' when the threshold voltage of the memory cell MC enters a forcing region that has a lower voltage than a target region. By utilizing the force data during a program execution operation, the bit-line voltage may be controlled, and the program threshold voltage distribution may be formed narrower.

The M-LATCH ML, the L-LATCH LL, and the C-LATCH CL may be utilized to store data externally input during the program operation, and may be referred to as data latches. When data of 3 bits is programmed in one memory cell MC, the data of 3 bits may be stored in the M-LATCH ML, the L-LATCH LL, and the C-LATCH CL, respectively. Until a program of the memory cell MC is completed, the M-LATCH ML, the L-LATCH LL, and the C-LATCH CL may maintain the stored data. Alternatively or additionally, the C-LATCH CL may receive data read from a memory cell MC during the read operation from the S-LATCH SL, and output the received data to the outside via the data input/output line.

Alternatively or additionally, the main unit MU may further include first through fourth transistors NM1 through NM4. The first transistor NM1 may be connected between (e.g., directly connected between) the sensing node SO and the S-LATCH SL, and may be driven by a ground control signal SOGND. The second transistor NM2 may be connected between (e.g., directly connected between) the sensing node SO and the F-LATCH FL, and may be driven by a forcing monitoring signal MON_F. The third transistor NM3 may be connected between (e.g., directly connected between) the sensing node SO and the M-LATCH ML, and may be driven by a higher bit monitoring signal MON_M. The fourth transistor NM4 may be connected between (e.g., directly connected between) the sensing node SO and the L-LATCH LL, and may be driven by a lower bit monitoring signal MON_L.

Alternatively or additionally, the main unit MU may further include fifth and sixth transistors NM5 and NM6 connected to each other in series between the bit-line selection transistor TV_hv and the sensing node SO. The fifth transistor NM5 may be driven by a bit-line shut-off signal BLSHF, and the sixth transistor NM6 may be driven by a bit-line connection control signal CLBLK. Alternatively or additionally, the main unit MU may further include a precharge transistor PM. The precharge transistor PM may be connected to the sensing node SO, driven by a load signal LOAD, and precharge the sensing node SO to a precharge level in a precharge period.

In some example embodiments, the main unit MU may further include a pair of pass transistors connected to the sensing node SO, or first and second pass transistors TR and TR'. According to some example embodiments, the first and second pass transistors TR and TR' may also be referred to as first and second sensing node connection transistors, respectively. The first and second pass transistors TR and TR' may be driven in response to a pass control signal SO_PASS. According to some example embodiments, the pass control signal SO_PASS may be referred to as a sensing node connection control signal. The first pass transistor TR may be connected between a first terminal SOC_U and the sensing node SO, and the second pass transistor TR' may be between the sensing node SO and a second terminal SOC_D.

In some example embodiments, when the page buffer unit PBU corresponds to the second page buffer unit PBU1 in FIG. 5, the first terminal SOC_U may be connected to one end of the pass transistor included in the first page buffer unit PBU0, and the second terminal SOC_D may be connected to one end of the pass transistor included in the third page buffer unit PBU2. In this manner, the sensing node SO may be electrically connected to the combined sensing node SOC via pass transistors included in each of the third through (n+1)th page buffer units PBU2 through PBUn.

During the program operation, the page buffer PB may verify whether the program is completed in a memory cell MC selected among the memory cells MC included in the NAND string connected to the bit-line BL. The page buffer PB may store data sensed via the bit-line BL during the program verify operation in the S-LATCH SL. The M-LATCH ML and the L-LATCH LL may be set in which target data is stored according to the sensed data stored in the S-LATCH SL. In some example embodiments, when the sensed data indicates that the program is completed, the M-LATCH ML and the L-LATCH LL may be switched to a program inhibit setup for the selected memory cell MC in a subsequent program loop. The C-LATCH CL may temporarily store input data provided from the outside. During the program operation, the target data to be stored in the C-LATCH CL may be stored in the M-LATCH ML and the L-LATCH LL.

Hereinafter, assuming that signals for controlling elements in the page buffer circuit 210 are included in the page buffer control signal PBCTL1 in FIG. 1.

Figure 7:
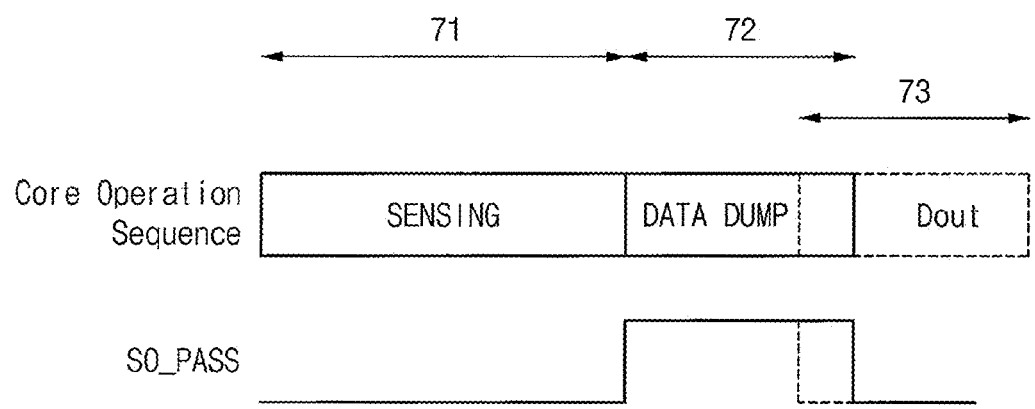
FIG. 7 is a timing diagram of an example of a voltage level of a pass control signal according to a core operation sequence, according to example embodiments.

FIG. 7 is a timing diagram of an example of a voltage level of a pass control signal according to a core operation sequence, according to example embodiments.

Referring to FIGS. 6 and 7 together, the core operation sequence may represent the operation of the page buffer PB, and in some example embodiments, the core operation sequence may include a data sensing period 71 in which a data sensing operation is performed, a data dumping period in which a data dumping operation is performed, or a data transfer period 72 and a data output period 73 in which dumped data is outputted to data I/O lines (data output operation Dout is performed).

In the data sensing period 71, the pass control signal SO_PASS may be deactivated, and the first and second pass transistors TR and TR' may be turned off. Accordingly, the page buffer unit PBU may not be electrically connected to the combined sensing node SOC, that is, the page buffer unit PBU may not be electrically connected to the cache unit CU. Alternatively or additionally, the page buffer unit PBU may not also be electrically connected to an adjacent page buffer unit PBU. In some example embodiments, the data sensing period 71 may include a precharge period in which an operation of precharging the voltage of the bit-line BL or the voltage of the sensing node SO to a precharge level is performed, a development period in which an operation of electrically connecting the bit-line BL to the sensing node SO and developing a voltage of the sensing node SO, and a sensing period in which an operation of sensing the voltage of the sensing node SO is performed.

In the data transfer period 72, the pass control signal SO_PASS may be activated, and the first and second pass transistors TR and TR' may be turned on. Accordingly, the page buffer unit PBU may be electrically connected to the combined sensing node SOC, that is, the page buffer unit PBU may be electrically connected to the cache unit CU. Alternatively or additionally, the page buffer unit PBU may be electrically connected to an adjacent page buffer unit PBU. In some example embodiments, the data transfer period 72 may include a period in which an operation of dumping read data stored in the S-LATCH SL to the C-LATCH CL is performed, and a period in which an operation of dumping program data stored in the S-LATCH SL to the S-LATCH SL (data dumping operation) is performed, or a period in which data stored in the C-LATCH CL is transferred to a data input/output circuit, etc. The data transfer period 72 may be partially overlapped with the data output period.

Figure 14:
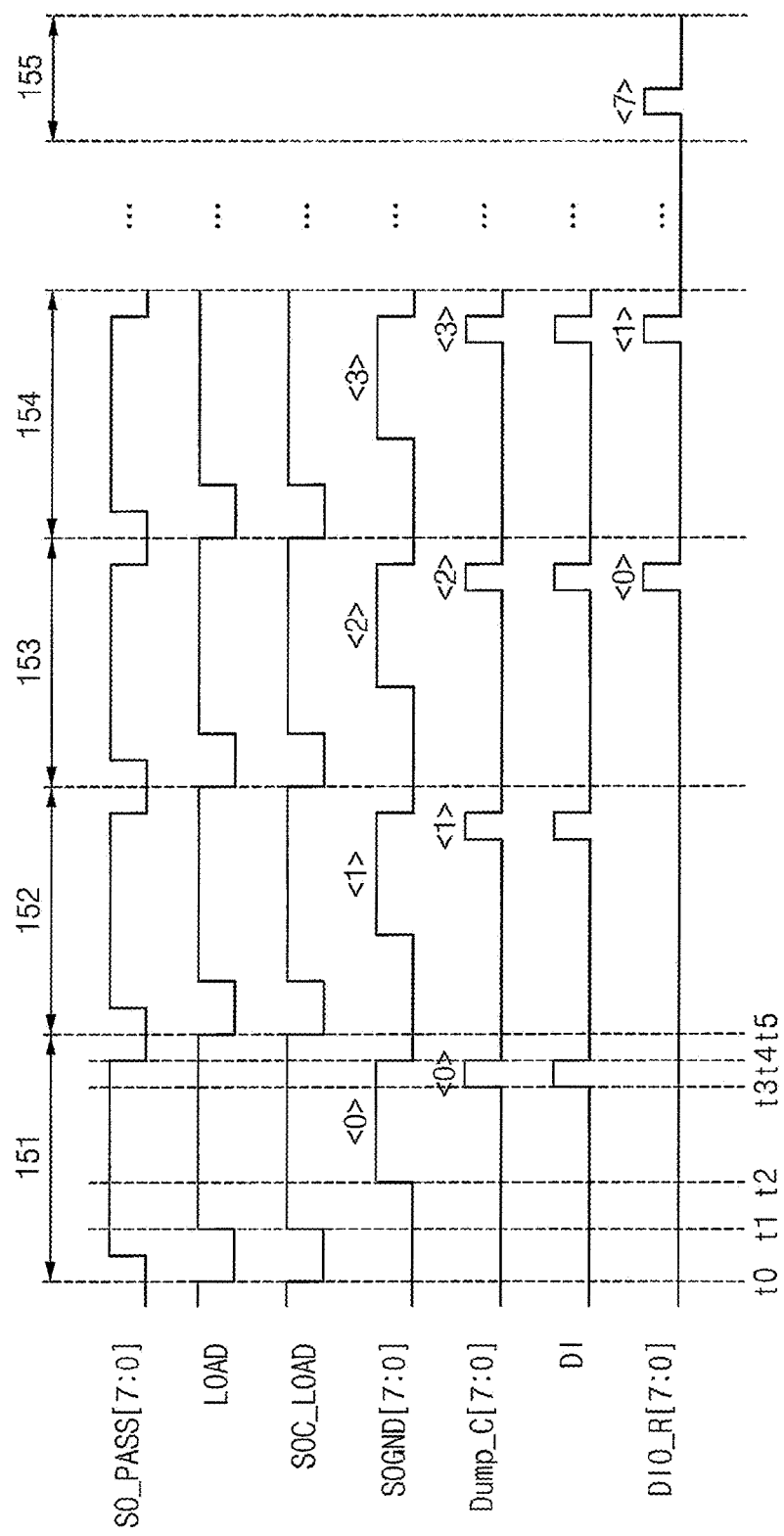
FIG. 14 is a timing diagram illustrating an example of data dumping operation and data output operation of the page buffer circuit according to example embodiments.

The data dumping operation is sequentially performed per stage of the page buffer unit PBU and when the data dumping operation is sequentially performed per stage of the page buffer unit PBU, the pass control signal SO_PASS may be repeatedly activated and deactivated as illustrated in FIG. 14. In some example embodiments, when the data dumping operation is performed between the page buffer unit in a third stage (for example, PUB2 in FIG. 5) and the cache latch (for example, CL2 in FIG. 5) corresponding to the page buffer unit in the third stage, the pass control signal SO_PASS applied to the page buffer unit in the third stage (for example, PUB2 in FIG. 5) through the page buffer unit in the eighth stage (for example, PUB7 in FIG. 5). Alternatively or additionally, when the data dumping operation is performed between the page buffer unit in a fourth stage (for example, PUB3 in FIG. 5) and the cache latch (for example, CL3 in FIG. 5) corresponding to the page buffer unit, the pass control signal SO_PASS applied to the page buffer unit in the fourth stage (for example, PUB3 in FIG. 5) through the page buffer unit in the eighth stage (for example, PUB7 in FIG. 5).

FIG. 8 is a timing diagram of another example of a voltage level of the pass control signal according to a core operation sequence, according to example embodiments.

Referring to FIGS. 6 and 8 together, the core operation sequence may represent the operation of the page buffer PB. In some example embodiments, the core operation sequence may be a bit-line setup period 81, a forcing dumping period 82, a bit-line forcing period 83, a data transfer period or a data dumping period 84, and a mass bit count (MBC) period 85.

In the bit-line setup period 81, the pass control signal SO_PASS may be activated, and the first and second pass transistors TR and TR' may be turned on. In some example embodiments, the sensing node SO and the combined sensing node SOC may be electrically connected to each other, and accordingly, data may be dumped from the main latch included in the page buffer unit PBU (for example, the S-LATCH SL, the F-LATCH FL, the M-LATCH ML or the L-LATCH LL) to the C-LATCH CL.

In the forcing dumping period 82 and the bit-line forcing period 83, the pass control signal SO_PASS may be deactivated, and the first and second pass transistors TR and TR' may be turned off. Accordingly, the page buffer unit PBU may not be electrically connected to the cache unit CU, and may not also be electrically connected to the adjacent page buffer unit PBU. In the forcing dumping period 82, when the program is performed, the dumping operation for selecting a bit-line BL to be forced to a bias less than a power supply voltage level may be performed. In some example embodiments, data may be dumped from the F-LATCH FL to the S-LATCH SL. In the bit-line forcing period 83, a voltage applied to the bit-line BL may vary according to a value stored in the F-LATCH FL during a program execution.

In the data transfer period 84, the pass control signal SO_PASS may be activated, and the first and second pass transistors TR and TR' may be turned on. In some example embodiments, in the data transfer period 84, a dumping operation to mark the data, which is stored in the S-LATCH SL connected to the memory cells MC which has failed as a result of the program verification operation among the memory cells MC which are to be programmed in the target program state when the program is executed, to logic low may be performed. In some example embodiments, because the sensing node SO and the combined sensing node SOC are electrically connected to each other, the data may be dumped from the C-LATCH CL to the main latch (for example, the S-LATCH SL).

In the mass bit count period 85, the pass control signal SO_PASS may be deactivated, and the first and second pass transistors TR and TR' may be turned off. Accordingly, the page buffer unit PBU may not be electrically connected to the cache unit CU, and may not also be electrically connected to the adjacent page buffer unit. In the mass bit counting period 85, the number of S-LATCHs SL marked as logic low in the previous data transfer period 84 may be counted.

FIG. 9 is a plan view of a page buffer circuit according to example embodiments.

Referring to FIGS. 3 and 9 together, the first semiconductor layer L1 may include the memory cell array 100, and the memory cell array 100 may include the plurality of memory cells MC respectively connected to the plurality of bit-lines BL extending in the first horizontal direction HD1. That is, the plurality of memory cells MC may connect to respective ones of the plurality of bit-lines BL extending in the first horizontal direction HD1. In some example embodiments, the plurality of bit-lines BL may be implemented as a first metal layer M1. In some example embodiments, the first metal layer M1 may be formed by using double patterning technology (DPT).

The second semiconductor layer L2 may include the page buffer circuit 210a, and a first lower metal layer LM0 extending in the first horizontal direction HD1 may be above the page buffer circuit 210a. A third lower metal layer LM2 extending in the first horizontal direction HD1 may be above the first lower metal layer LM0. Although not illustrated, a second lower metal layer extending in the second horizontal direction HD2 may be further arranged between the first lower metal layer LM0 and the third lower metal layer LM2. In some example embodiments, the first and third lower metal layers LM0 and LM2 may be formed without using DPT, and accordingly, a pitch of metal patterns included in each of the first and third lower metal layers LM0 and LM2 may be greater than a pitch of metal patterns included in the first metal layer M1.

The page buffer circuit 210a may include first through eighth page buffer units PBU0 through PBU7 in the first horizontal direction HD1 and first through eighth cache units CU0 through CU7 in the first horizontal direction HD1. The first through eighth page buffer units PBU0 through PBU7 may be in a main region MR, the first through eighth cache units CU0 through CU7 may be in a cache region CR, and the main region MR and the cache region CR may be adjacent to each other in the first horizontal direction HD1. The first and third lower metal layers LM0 and LM2 may be used to transmit a control signal to each of transistors included in the first through eighth page buffer units PBU0 through PBU7 and the first through eighth cache units CU0 through CU7, or may be used to connect each of the transistors to a power terminal or a ground terminal.

Figure 10A:
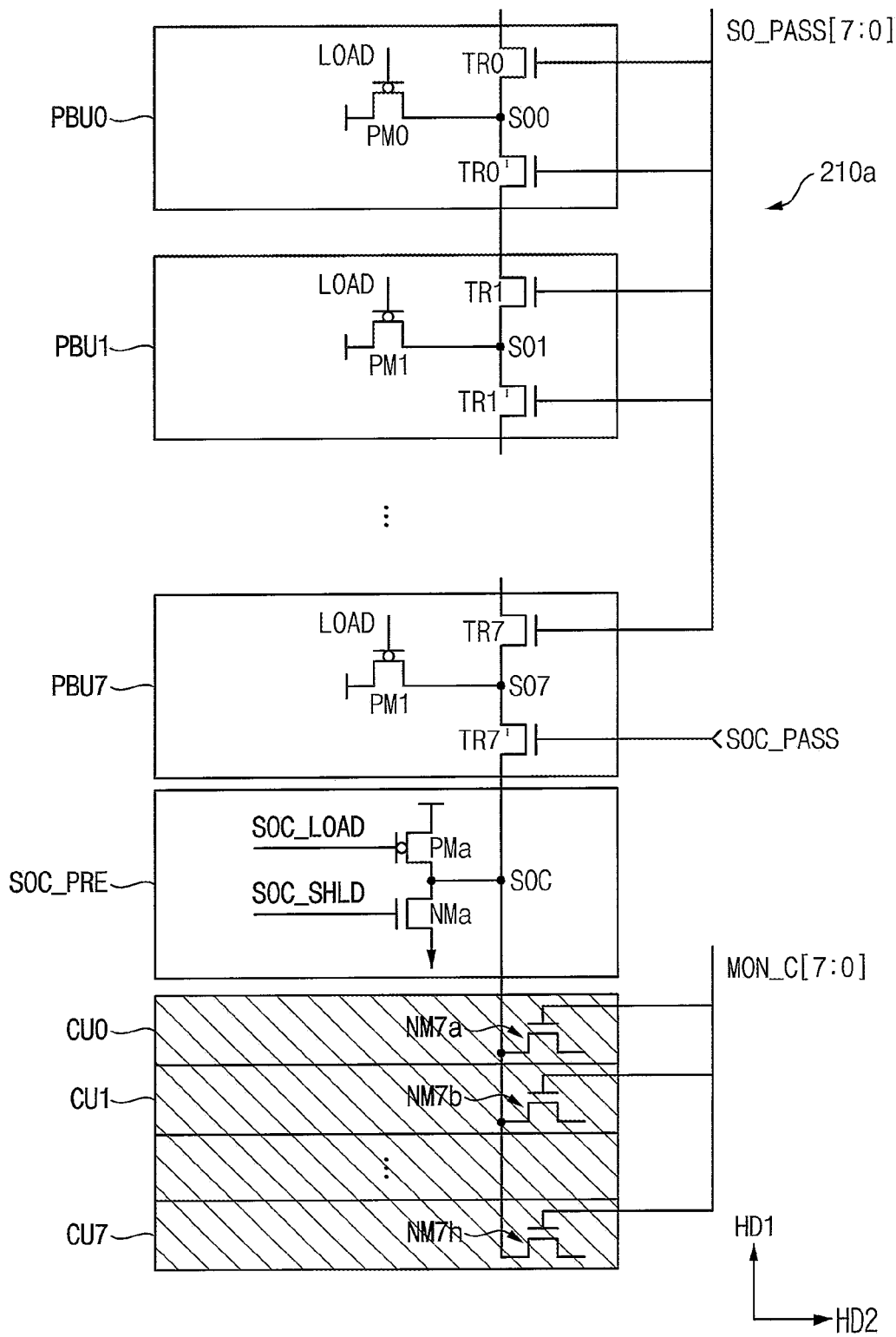
FIG. 10A is a circuit diagram illustrating an example of the page buffer circuit in FIG. 9 according to example embodiments.

FIG. 10A is a circuit diagram illustrating an example of the page buffer circuit in FIG. 9 according to example embodiments.

Hereinafter, the configuration of the page buffer circuit 210a will be described in detail with reference to FIGS. 9 and 10A together.

Each page buffer unit may include two pass transistors, and accordingly, the page buffer circuit 210a may include 16 pass transistors TR0, TR0', . . . , TR7, TR7', and the 16 pass transistors TR0, TR0', . . . , TR7, TR7' may be connected to each other in series.

In some example embodiments, the first page buffer unit PBU0 may include the first and second pass transistors TR0 and TR0' connected in series. In some example embodiments, the first pass transistor TR0 may be adjacent to a first boundary of the first page buffer unit PBU0, the second pass transistor TR0' may adjacent to a second boundary of the first page buffer unit PBU0, and the first boundary and the second boundary may face each other. In some example embodiments, the first and second pass transistors TR0 and TR0' may be implemented as NMOS transistors, and accordingly, may be at both ends of the P well of the first page buffer unit PBU0, but the inventive concepts are not limited thereto. On the other hand, another semiconductor device, in some example embodiments, a PMOS transistor, may be further arranged between the first boundary of the first page buffer unit PBU0 and the first pass transistor TR0. Similarly, another semiconductor device, in some example embodiments, a PMOS transistor, may be further arranged between the second boundary of the first page buffer unit PBU0 and the second pass transistor TR0'.

In some example embodiments, the first page buffer unit PBU0 may further include, between the first pass transistor TR0 and the second pass transistor TR0', a plurality of transistors arranged in the first horizontal direction (for example, the S-LATCH SL, the F-LATCH FL, the M-LATCH ML and the L-LATCH LL, the first through sixth transistors NM1 through NM6 in FIG. 6, or the like). Hereinafter, a description will be given focusing on the configuration of the first page buffer unit PBU0, and each of the second through eighth page buffer units PBU1 through PBU7 may be configured substantially the same as the first page buffer unit PBU0.

The first pass transistor TR0 may include a source S0, a drain D0, and a gate G0. The source S0 of the first pass transistor TR0 may be connected to a first terminal (for example, SOC_U in FIG. 6), and the drain D0 of the first pass transistor TR0 may be connected to a first sensing node S00. A pass control signal SO_PASS [7:0] may be applied to the gate G0 of the first pass transistor TR0.

The second pass transistor TR0' may include a source S0', a drain D0', and a gate G0'. The source S0' of the second pass transistor TR0' may be connected to the first sensing node S00, and the drain D0' of the second pass transistor TR0' may be connected to a second terminal (In some example embodiments, SOC_D in FIG. 6). The pass control signal SO_PASS [7:0] may be applied to the gate G0' of the second pass transistor TR0'.

The second page buffer unit PBU1 may include the first and second pass transistors TR1 and TR1' connected in series. The first pass transistor TR1 may include a source S1, a drain D1, and a gate G1, and the second pass transistor TR1' may include a source S1', a drain D1', and a gate G1'. The pass control signal SO_PASS[7:0] may be applied to the gates G1 and G1' of the first and second pass transistors TR1 and TR1', respectively.

The eighth page buffer unit PBU7 may include the first and second pass transistors TR7 and TR7' connected in series. The first pass transistor TR7 may include a source S7, a drain D7, and a gate G7, and the second pass transistor TR7' may include a source S7', a drain D7', and a gate G7'. The pass control signal SO_PASS[7:0] may be applied to the gates G7 and G7' of the first and second pass transistors TR7 and TR7', respectively. However, the inventive concepts are not limited thereto, and in some example embodiments, the combined sensing node pass control signal SOC_PASS may be applied to the gate G7' of the second pass transistor TR7'.

The first cache unit CU0 may include a monitor transistor NM7a, and the monitor transistor NM7a may include a source S, a drain D, and a gate G (refer to FIG. 9). In some example embodiments, the monitor transistor NM7a may correspond to the transistor NM7 in FIG. 6. The source S of the monitor transistor NM7a may be connected to the combined sensing node SOC, and a cache monitoring signal MON_C[7:0] may be applied to the gate G of the monitor transistor NM7a.

Although not illustrated, the first cache unit CU0 may further include a plurality of transistors in the first horizontal direction HD1 (for example, the plurality of transistors included in the C-LATCH CL in FIG. 6). Each of the second through eighth cache units CU1 through CU7 may have substantially the same configuration as the first cache unit CU0. The monitor transistors NM7a through NM7h included in each of the first through eighth cache units CU0 through CU7 may be commonly connected in parallel to the coupling sensing node SOC. Sources of each of the monitor transistors NM7a through NM7h may be commonly connected to the coupling sensing node SOC.

In the first page buffer unit PBU0, the drain D0 of the first pass transistor TR0 and the source S0' of the second pass transistor TR0' may be connected to each other via a first conductive line or a first metal pattern MT0a. The first metal pattern MT0a may correspond to the first sensing node SO0, and accordingly, may be referred to as the first sensing node line. In the second page buffer unit PBU1, the drain D1 of the first pass transistor TR1 and the source S1' of the second pass transistor TR1' may be connected to each other via a first conductive line or a first metal pattern MT0b. The first metal pattern MT0b may correspond to the second sensing node SO1, and accordingly, may be referred to as the second sensing node line.

In the eighth page buffer unit PBU7, the drain D7 of the first pass transistor TR7 and the source S7' of the second pass transistor TR7' may be connected to each other via a first metal pattern MT0c. The first metal pattern MT0c may correspond to the eighth sensing node SO7, and accordingly, may be referred to as an eighth sensing node line. In the eighth page buffer unit PBU7, the drain D7' of the second pass transistor TR7' and the source S of the monitor transistor NM7a of the first cache unit CU0 may be connected to each other via a first metal pattern MT0d. In some example embodiments, the first metal pattern MT0d may also be connected to the precharge circuit SOC_PRE. The first metal pattern MT0d may correspond to the combined sensing node SOC, and accordingly, may be referred to as a combined sensing node line. In some example embodiments, the first metal patterns MT0a, MT0b, MT0c, and MT0d may be implemented as the first lower metal layer LM0, and may occupy one track of the first lower metal layer LM0.

The drain D0' of the second pass transistor TR0' of the first page buffer unit PBU0 and the source S1 of the first pass transistor TR1 of the second page buffer unit PBU1 may be connected to each other via a second conductive line or the second metal pattern MT1a, and accordingly, the second metal pattern MT1a may be referred to as a node connection line. In some example embodiments, the second metal pattern MT1a may be implemented as the third lower metal layer LM2, and may occupy one track of the third lower metal layer LM2. However, the inventive concepts are not limited thereto, and the second metal pattern MT1a may be implemented as the second lower metal layer.

In some example embodiments in FIG. 10A, when the pass control signal SO_PASS is activated, the first and second pass transistors TR0 through TR7 and TR0' through TR7' may be turned on, and accordingly, the first and second pass transistors TR0 through TR7' included in the respective first through eighth page buffer units PBU0 through PBU7 may be connected to each other in series, and all of the first through eighth sensing nodes SO0 through SO7 may be connected to the combined sensing node SOC. The first and second sensing nodes SO0 and SO1 may be connected to each other via the first metal patterns MT0a and MT0b and the second metal pattern MT1a, and the seventh sensing node SO7 and the combined sensing node SOC may be connected to each other via the first metal patterns MT0c and MT0d.

The first metal patterns MT0a, MT0b, and MT0c corresponding to the first, second, and eighth sensing node lines, respectively, the second metal pattern MT1a corresponding to a node connection line, and the first metal pattern MT1d corresponding to the combined sensing node line may constitute a data transfer line. As described above, according to some example embodiments, eight data transfer lines for connecting the first through eighth page buffer units PBU0 through PBU7, respectively, to the first through eighth cache units CU0 through CU7 may not be separately needed, and the sensing node lines included in each of the first through eighth page buffer units PBU0 through PBU7 may be used as the data transfer lines. Accordingly, because the number of metal lines required for wiring of the page buffer circuit 210a may be reduced, the complexity of the layout may be reduced, and the size of the page buffer circuit 210a may be reduced.

Each of the first through eighth page buffer units PBU0 through PBU7 may further include respective one of first through eighth precharge transistors PM0 through PM7. In the first page buffer unit PBU0, the first precharge transistor PM0 may be connected between (e.g., directly connected between) the first sensing node SO0 and a voltage terminal to which a precharge level may be applied, and may include a gate to which a load signal LOAD may be applied. The first precharge transistor PM0 may precharge the first sensing node SO0 to the precharge level in response to the load signal LOAD.

The main region MU may include contact regions THVa and THVd. The contact region THVa may be between the first and second page buffer units PBU0 and PBU1, and the contact region THVd may be between a seventh page buffer unit (for example, PBU6 in FIG. 16) and the eighth page buffer unit PBU7. First and second bit-line contacts CT0 and CT1 respectively connected to the first and second bit-lines may be in the contact region THVa. That is, the first and second bit-line contacts CT0 and CT1 may connect to respective first and second bit-lines may be in the contact region THVa. The first bit-line contact CT0 may be connected to the first page buffer unit PBU0, and the second bit-line contact CT1 may be connected to the second page buffer unit PBU1.

The page buffer circuit 210a may further include a precharge circuit SOC_PRE between the eighth page buffer unit PBU7 and the first cache unit CU0. The precharge circuit SOC_PRE may include a precharge transistor PMa and a shielding transistor NMa for precharging the coupling sensing node SOC. The precharge transistor PMa may be driven by a coupling sensing node load signal SOC_LOAD, and when the precharge transistor PMa is turned on, the coupling sensing node SOC may be precharged to the precharge level. The shielding transistor NMa may be driven by a combined sensing node shielding signal SOC_SHLD, and when the shielding transistor NMa is turned on, the combined sensing node SOC may be discharged to a ground level.

As a transistor width WD decreases according to the miniaturization of the process, the area of the region occupied by the page buffer circuit 210a may decrease. In some example embodiments, the transistor width WD may correspond to a size of the gate G0 of the first pass transistor TR0 in the second horizontal direction HD2. As the transistor width WD decreases, the size of the first page buffer unit PBU0 in the second horizontal direction HD2 may decrease. However, despite the decrease in the transistor width WD, a pitch of the first lower metal layer LM0 may not decrease. Accordingly, the number of wirings of the first lower metal layer LM0 on the first page buffer unit PBU0, the size of which is reduced in the second horizontal direction HD2, that is, the number of metal patterns, may also be reduced. In some example embodiments, the number of metal patterns of the first lower metal layer LM0 corresponding to the first page buffer unit PBU0 may be reduced from six to four.

In this manner, when the number of metal patterns of the first lower metal layer LM0 corresponding to the first page buffer unit PBU0 decreases, the sensing reliability of the first page buffer unit PBU0 may decrease. In some example embodiments, during the sensing operation, to reduce or prevent a coupling between the first sensing node SO0 and an adjacent node, a metal pattern adjacent to the first sensing node SO0 is used as a shielding line to which a fixed bias may be applied. However, when the metal pattern corresponding to the shielding line is removed due to the reduction of the metal pattern, an issue of voltage variation at the first sensing node SO0 due to the coupling between the first sensing node SO0 and the adjacent node may occur, and as a result, the sensing reliability of the first page buffer unit PBU0 may be deteriorated.

However, according to some example embodiments, such as in FIG. 10A, by separately arranging the first page buffer unit PBU0 and the first cache unit CU0, the degree of freedom of the metal patterns include in the first and third lower metal layers LM0 and LM2 on the first page buffer unit PBU0 may increase, and thus at least one of the metal patterns included in the first and third lower metal layers LM0 and LM2 may be used as a shielding line for the first sensing node SO0. Accordingly, an increase in voltage fluctuation at the first sensing node SO0 may be reduced or prevented, and thus, a decrease in the sensing reliability of the first page buffer unit PBU0 may be reduced or prevented.

On the other hand, in a structure in which the first through eighth page buffer units PBU0 through PBU7 are separate from the first through eighth cache units CU0 through CU7, when eight signal lines for connecting the first through eighth page buffer units PBU0 through PBU7, respectively, to the first through eighth cache units CU0 through CU7 are arranged, the size of the page buffer circuit 210a in the second horizontal direction HD2 may increase again.

However, according to some example embodiments, such as in FIG. 10A, the first through eighth sensing nodes SO0 through SO7 may be connected to each other by using the first and second pass transistors TR0 through TR7 and TR0' through TR7' included in each of the first through eighth page buffer units PBU0 through PBU7, and the first through eighth sensing nodes SO0 through SO7 may be connected to the first through eighth cache units CU0 through CU7 via the combined sensing node SOC, respectively. In some example embodiments, because a sensing node line for connecting the first and second pass transistors to each other is implemented by using the metal patterns of one track of the first lower metal layer LM0 (for example, MT0a and MT0b), an increase in a size of the page buffer circuit 210a in the second horizontal direction HD2 may be reduced or prevented.

Figure 10B:
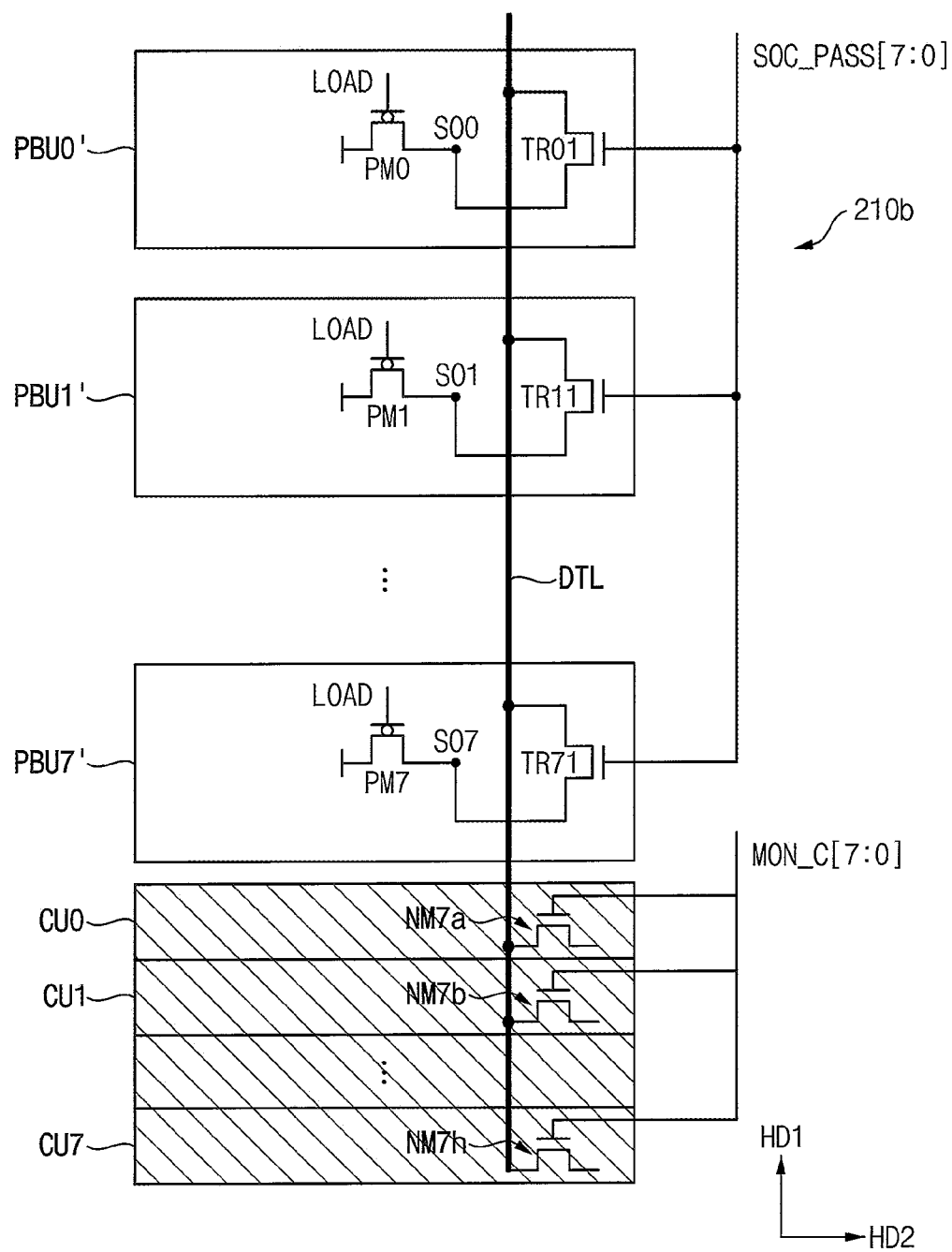
FIG. 10B is a circuit diagram illustrating an example of the page buffer circuit according to example embodiments.

FIG. 10B is a circuit diagram illustrating an example of the page buffer circuit according to example embodiments.

Referring to FIG. 10B, a page buffer circuit 210b may include first through eighth page buffer units PBU0' through PBU7' disposed in the first horizontal direction HD1 and first through eighth cache units CU0 through CU7 disposed in the first horizontal direction HD1.

When the first through eighth page buffer units PBU0' through PBU7' are compared with the first through eighth page buffer units PBU0 through PBU7 in the page buffer circuit 210a in FIG. 10A, each of the first through eighth page buffer units PBU0' through PBU7' includes respective one of first through eighth pass transistors TR01 through TR71, the first through eighth pass transistors TR01 through TR71 are commonly connected to a data transmission line DTL and each of the first through eighth pass transistors TR01 through TR71 is connected to respective ones of the first through eighth sensing nodes SO0 through SO7. The data transmission line DTL extends in the first horizontal direction HD1. The first through eighth cache units CU0 through CU7 are commonly connected to the data transmission line DTL. The data transmission line DTL may be provided by using a metal layer on the first through eighth cache units CU0 through CU7.

Each of bits of the pass control signal SO_PASS[7:0] may be applied to each gate of the first through eighth pass transistors TR01 through TR71.

FIG. 11 is a timing diagram of voltage levels of a plurality of pass control signals according to a core operation sequence, according to example embodiments.

Referring to FIGS. 10A and 11 together, the core operation sequence may include a data sensing period 111 in which the data sensing operation is performed and a data dumping period or a data transfer period 112 in which the data dumping operation is performed. Hereinafter, it will be described that the pass control signal SO_PASS[7:0] includes the first through eighth pass control signals SO_PASS<0> through SO_PASS<7> corresponding to the first through eighth page buffer units PBU0 through PBU7, respectively.

In the data sensing period 111, all of the first through eighth pass control signals SO_PASS<0> through SO_PASS<7> may be deactivated, and all of the first and second pass transistors TR0 through TR7 and TR0' through TR7' which are included in each of the first through eighth page buffer units PBU0 through PBU7 may be turned off. Accordingly, the first through eighth page buffer units PBU0 through PBU7 may not be electrically connected to each other, and the first through eighth sensing nodes SO0 through SO7 may be insulated from each other. Alternatively or additionally, the first through eighth sensing nodes SO0 through SO7 may not be electrically connected to the combined sensing node SOC, that is, the first through eighth page buffer units PBU0 through PBU7 may not be electrically connected to the first through eighth cache units CU0 through CU7.

In the data transfer period 112, to individually control connections between the first through eighth page buffer units PBU0 through PBU7 and the first through eighth cache units CU0 through CU7, the first and second pass transistors TR0 through TR7 and TR0' through TR7' included in each of the first through eighth page buffer units PBU0 through PBU7 may be selectively turned on. As a result, an amount of current consumed in the data dumping operation may be reduced. The data transfer period 112 may include first through eighth data transfer periods 1121 through 1128.

In the first data transfer period 1121, all of the first through eighth pass control signals SO_PASS<0> through SO_PASS<7> may be activated, and accordingly, all of the first and second pass transistors TR0 through TR7 and TR0' through TR7' included in each of the first through eighth units PBU0 through PBU7 may be turned on and connected in series. At this time, the first sensing node SO0 may be connected to the combined sensing node SOC via the second through eighth sensing nodes SO1 through S07, and the data dumping operation may be performed between the main latch in the first buffer unit PBU0 (for example, one of the S-LATCH SL, the F-LATCH FL, the M-LATCH ML, and the L-LATCH LL in FIG. 6) and a cache latch in the first cache unit CU0 (for example, the C-LATCH CL in FIG. 6D).

In the second data transfer period 1122, the first pass control signal SO_PASS<0> may be deactivated, and the second through eighth pass control signals SO_PASS<1> through SO_PASS<7> may be activated. Accordingly, all of the first and second pass transistors TR1 through TR7 and TR1' through TR7' included in each of the second through eighth page buffer units PBU1 through PBU7 may be turned on and connected in series. In some example embodiments, the second sensing node SO1 may be connected to the combined sensing node SOC via the third through eighth sensing nodes SO2 through S07, and the data dumping operation may be performed between the main latch in the second page buffer unit PBU1 and a cache latch in the second cache unit CU1. In some example embodiments, because the first and second pass transistors TR0 and TR0' included in the first page buffer unit PBU0 are turned off, current consumption may be reduced.

In the eighth data transfer period 1128, the first through seventh pass control signals SO_PASS<0> through SO_PASS<6> may be deactivated, and only the eighth pass control signal SO_PASS<7> may be activated. Accordingly, the first and second pass transistors TR7 and TR7' included in the eighth page buffer unit PBU7 may be turned on and connected in series. In some example embodiments, the eighth sensing node SO7 may be connected to the combined sensing node SOC, and the data dumping operation may be performed between a main latch in the eighth page buffer unit PBU7 and a cache latch in the eighth cache unit CU7. In some example embodiments, because the first and second pass transistors TR0 through TR6 and TR0' through TR6' included in the first through seventh page buffer units PBU0 through PBU6 are turned off, current consumption may be reduced.

Figure 12:
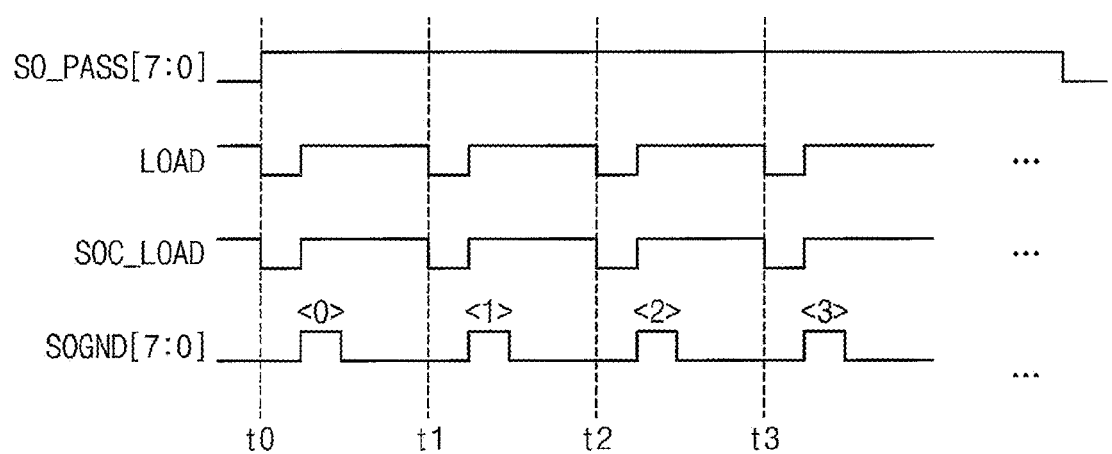
FIG. 12 is a timing diagram illustrating an example of data dumping operation of the page buffer circuit according to example embodiments.

FIG. 12 is a timing diagram illustrating an example of data dumping operation of the page buffer circuit according to example embodiments.

Referring to FIGS. 6, 10 and 12 together, data transfer operations between the plurality of page buffer units PBU0 through PBU7 and the plurality of cache units CU0 through CU7 in the page buffer circuit 210a may be sequentially performed.

During a period from a first time point t0 to a second time point t1, data may be dumped between the first page buffer unit PBU0 and the first cache unit CU0. At the first time point t0, the pass control signal SO_PASS[7:0] may transition to a logic high level that is an enable level, and all of the first and second pass transistors TR0 through TR7 and TR0' through TR7' included in the first through eighth page buffer units PBU0 through PBU7 may be turned on. In some example embodiments, the pass control signal SO_PASS[7:0] may maintain a logic high level until the data dumping operation is completed between the first through eighth page buffer units PBU0 through PBU7 and the first through eighth cache units CU0 through CU7.

At the first time point t0, the load signal LOAD may transition to a logic low level that is the enable level, and all of the precharge transistors PM0 through PM7 included in each of the first through eighth page buffer units PBU0 through PBU7 may be turned on, and the first through eighth sensing nodes SO0 through SO7 may be precharged to the precharge level. Alternatively or additionally, at the first time point t0, the combined sensing node load signal SOC_LOAD may transition to a logic low level that is an enable level, the precharge transistor PMa included in the precharge circuit SOC_PRE may be turned on, and the combined sensing node (SOC) may be precharged to the precharge level. Next, the load signal LOAD and the combined sensing node load signal SOC_LOAD may transition to a logic high level, and the ground control signal SOGND[7:0] applied to the first page buffer unit PBU0 may be transition to the logic high that is the enable level. In some example embodiments, the first sensing node SO0 and the S-LATCH SL included in the first page buffer unit PBU0 may be electrically connected to each other, and data may be dumped between the first sensing node SO0 and the S-LATCH SL included in the first page buffer unit PBU0.

During a period from the second time point t1 to a third time point t2, data may be dumped between the second page buffer unit PBU1 and the second cache unit CU1. At the second time point t1, the load signal LOAD and the combined sensing node load signal SOC_LOAD may transition to a logic low level that is an enable level, and the first through eighth sensing nodes SO0 through SO7 and the combined sensing node SOC may be precharged to the precharge level. Next, the load signal LOAD and the combined sensing node load signal SOC_LOAD may be transitioned to a logic high level, and the ground control signal SOGND[7:0] applied to the second page buffer unit PBU1 may be transitioned to a logic high level that is the enable level. In some example embodiments, the second sensing node SO1 and the S-LATCH SL included in the second page buffer unit PBU1 may be electrically connected to each other, and data may be dumped between the S-LATCH SL included in the second page buffer unit PBU1 and the second cache unit CU1. During a period from the third time point t2 to a fourth time point t3, data may be dumped between the third page buffer unit PBU2 and the third cache unit CU2, and during a period from the fourth time point t3 to a fourth time point, data may be dumped between the fourth page buffer unit PBU3 and the fourth cache unit CU3.

Figure 13:
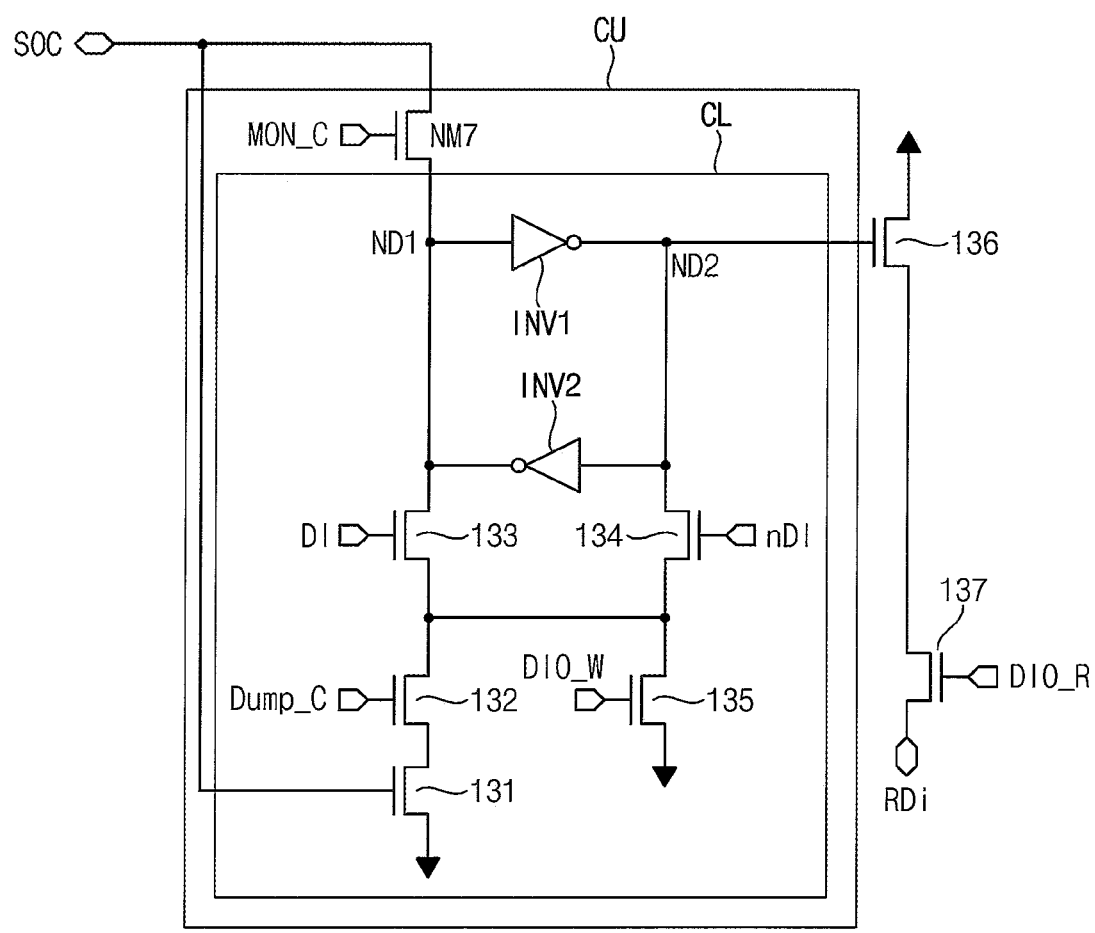
FIG. 13 is a circuit diagram illustrating an example of the cache unit according to example embodiments.

FIG. 13 is a circuit diagram illustrating an example of the cache unit according to example embodiments.

Referring to FIGS. 6 and 13, the cache unit CU may include the monitor transistor NM7 and the C-LATCH CL, and the C-LATCH CL may include first and second inverters INV1 and INV2, a dump transistor 132, and transistors 131, 133 to 135. The monitor transistor NM7 may be driven based on the cache monitoring signal MON_C, and may control a connection between the coupling sensing node SOC and the C-LATCH CL.

The first inverter INV1 may be connected between (e.g., directly connected between) the first node ND1 and the second node ND2, the second inverter INV2 may be connected between (e.g., directly connected between) the second node ND2 and the first node ND1, and thus, the first and second inverters INV1 and INV2 may form a latch. The transistor 131 may include a gate connected to the combined sensing node SOC. The dump transistor 132 may be driven by a dump signal Dump_C, and may transmit data stored in the C-LATCH CL to a main latch, in some example embodiments, the S-LATCH SL in the page buffer unit PBU. The transistor 133 may be driven by a data signal DI, a transistor 134 may be driven by a data inversion signal nDI, and the transistor 135 may be driven by a write control signal DIO_W. When the write control signal DIO_W is activated, voltage levels of the first and second nodes ND1 and ND2 may be determined based on the data signal DI and the data inversion signal nDI, respectively.

The cache unit CU may be connected to an data I/O line (or data I/O terminal) RDi via transistors 136 and 137. The transistor 136 may include a gate connected to the second node ND2, and may be turned on or off based on a voltage level of the second node ND2. The transistor 137 may be driven by a read control signal DIO_R. When the read control signal DIO_R is activated and the transistor 137 is turned on, a voltage level of the input/output terminal RDi may be determined as '1' or '0' based on a state of the C-LATCH CL.

Figure 16:
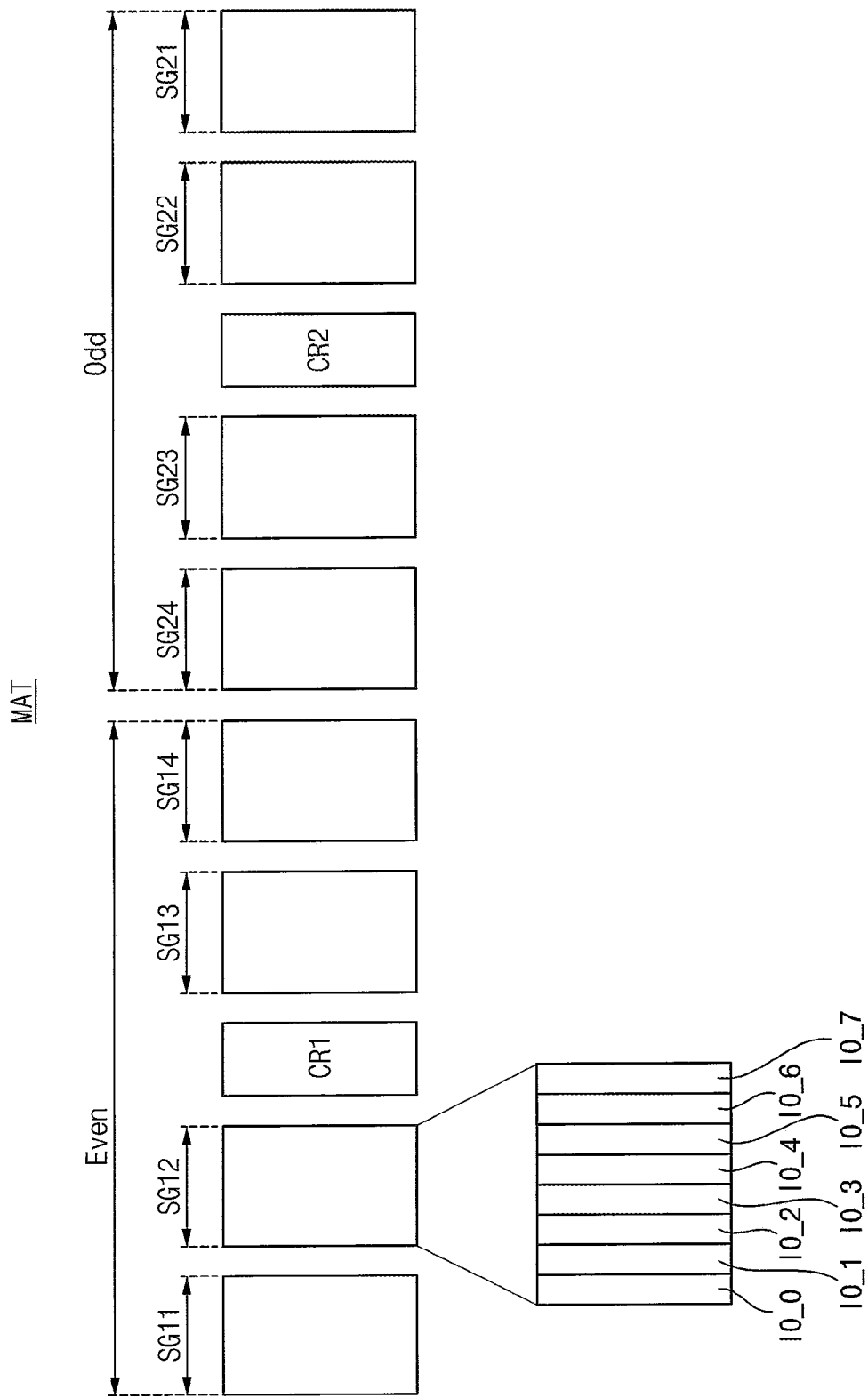
FIG. 16 illustrates a configuration of data I/O lines corresponding to one mat according to example embodiments.
Figure 17:
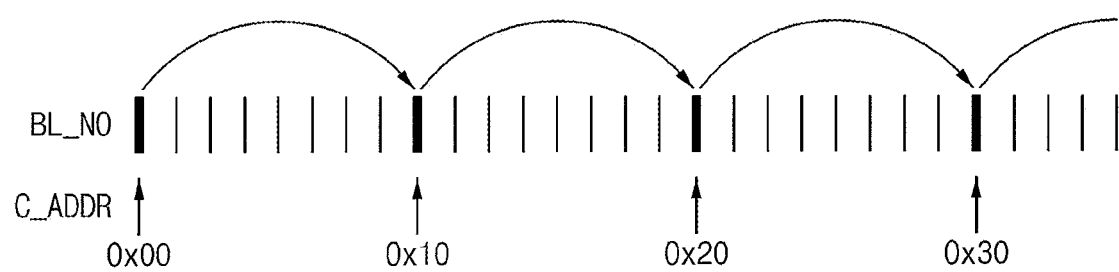
FIG. 17 illustrates mapping relation between a burst length and a column address in the page buffer circuit according to example embodiments.

FIG. 17 is a timing diagram of an example of the data dumping operation of the page buffer circuit 210a, according to some example embodiments of the inventive concepts. Referring to FIGS. 10, 16, and 17 together, during the data dumping operation of the page buffer circuit 210a, the pass control signal SO_PASS[7:0] may maintain a logic high that is an enable level, and all of the first and second pass transistors TR0 through TR7 and TR0' through TR7' may be turned on. Accordingly, the first through eighth sensing nodes SO0 through SO7 may be connected to the combined sensing node SOC, and may be connected to the first through eighth cache units CU0 through CU7 via the combined sensing node SOC. In first through fourth periods 141 through 144, data may be sequentially dumped between the first through fourth page buffer units (for example, PBU0 through PBU3 in FIG. 16) and the first through fourth cache units (for example, CU0 through CU3 in FIG. 16). In a fifth period 145, data stored in the first through eighth cache units CU0 through CU7 may be output via the data input/output line.

In the first period 141, the data dumping operation may be performed between the first page buffer unit PBU0 and the first cache unit CU0. The first period 141 may correspond to a period from the second time point t1 to a seventh time point t6, and hereinafter, the operation of the page buffer circuit 210a in the first period 141 will be described. The operation of the page buffer circuit 210a in the second through fourth periods 142 through 144 may correspond to the operation of the page buffer circuit 210a in the first period 141.

At the first time point t0, the load signal LOAD and the combined sensing node load signal SOC_LOAD may be transitioned to a logic low that is an enable level, and all of the precharge transistors PM0 through PM7 and PMa may be turned on, and the first through eighth sensing nodes SO0 through SO7 and the combined sensing node SOC may be precharged at a precharge level. At the second time point t1, the load signal LOAD and the combined sensing node load signal SOC_LOAD may be transitioned to a logic high that is a disable level. The period from the first time point t0 to the second time point t1 may be referred to as the precharge period.

At the third time point t2, the first ground control signal SOGND[7:0] applied to the first page buffer unit PBU0 may be transitioned to a logic high that is an enable level, and at the fourth time point t3, the first ground control signal SOGND[7:0] may be transitioned to a logic low. At the fifth time point t4, a first dump signal Dump_C[7:0] and the data signal DI applied to the first cache unit CU0 may be transitioned to a logic high that is an enable level.

When the data dumping operation between the first through eighth page buffer units PBU0 through PBU7 and the first through eighth cache units CU0 through CU7 is completed, in the fifth period 145, the read control signal DIO_R may be activated to a logic high that is an enable level. Accordingly, data stored in each of the first through eighth cache units CU0 through CU7 may be output via the data input/output line.

FIG. 14 is a timing diagram illustrating an example of data dumping operation and data output operation of the page buffer circuit according to example embodiments.

Referring to FIGS. 10A, 13 and 14 together, the data dumping operation of the page buffer circuit 210a may include first through fifth periods 151 through 155. In first through fourth periods 151 through 154, data may be sequentially dumped between the first through fourth page buffer units (for example, PBU0 through PBU3 in FIG. 21) and the first through fourth cache units (for example, CU0 through CU3 in FIG. 21). In the third period 153, the data dumping operation of the third page buffer unit (for example, PUB2 in FIG. 21) and the data output operation of the first cache latch unit (for example, CU0 in FIG. 21) may be simultaneously performed. In the fourth period 154, the data dumping operation of the fourth page buffer unit (for example, PUB4 in FIG. 21) and the data output operation of the second cache latch unit (for example, CU1 in FIG. 21) may be simultaneously performed.

In the first period 151, the data dumping operation may be performed between the first page buffer unit PBU0 and the first cache unit CU0. The first period 151 may correspond to a period from the second time point t1 to the sixth time point t5, and hereinafter, the operation of the page buffer circuit 210a in the first period 151 will be described. The operation of the page buffer circuit 210a in the second through fourth periods 152 through 154 may correspond to the operation of the page buffer circuit 210a in the first period 151.

At the first time point t0, the load signal LOAD and the combined sensing node load signal SOC_LOAD may be transitioned to a logic low level that is an enable level, and all of the precharge transistors PM0 through PM7 and PMa may be turned on, and the first through eighth sensing nodes SO0 through SO7 and the combined sensing node SOC may be precharged at a precharge level. Next, the pass control signal SO_PASS[7:0] may be transitioned to a logic high level that is an enable level, and all of the first and second pass transistors TR0 through TR7 and TR0' through TR7' may be turned on. At the second time point t1, the load signal LOAD and the combined sensing node load signal SOC_LOAD may be transitioned to a logic high level that is a disable level. The period from the first time point t0 to the second time point t1 may be referred to as the precharge period.

At the third time point t2, the first ground control signal SOGND[7:0] applied to the first page buffer unit PBU0 may be transitioned to a logic high level that is an enable level, and at the fourth time point t3, the first dump signal Dump_C[7:0] and the data signal DI applied to the first cache unit CU0 may be transitioned to a logic high level that is an enable level. At the fifth time point t4, the pass control signal SO_PASS [7:0], the first ground control signal SOGND[7:0], the first dump signal Dump_C[7:0], and the data signal DI may all be transitioned to a logic low level that is an enable level.

When the data dumping operation between the first through third page buffer units PBU0 through PBU2 and the first through third cache units CU0 through CU2 is completed, in the third period 153, the read control signal DIO_R[0] may be activated to a logic high level that is an enable level. Accordingly, data stored in each of the first cache unit CU0 may be output via the data I/O line. Alternatively or additionally, in the fourth period 154, the read control signal DIO_R[1] may be activated to a logic high level that is an enable level. Accordingly, data stored in the second cache unit CU1 may be output via the data I/O line. Alternatively or additionally, in the fifth period 155, the read control signal DIO_R[7] may be activated to a logic high level that is an enable level. Accordingly, data stored in the eighth cache unit CU7 may be output via the data I/O line.

Description associated with the timing diagram in FIG. 14 may be similarly applied to the page buffer circuit 210b in FIG. 10B.

Figure 15A:
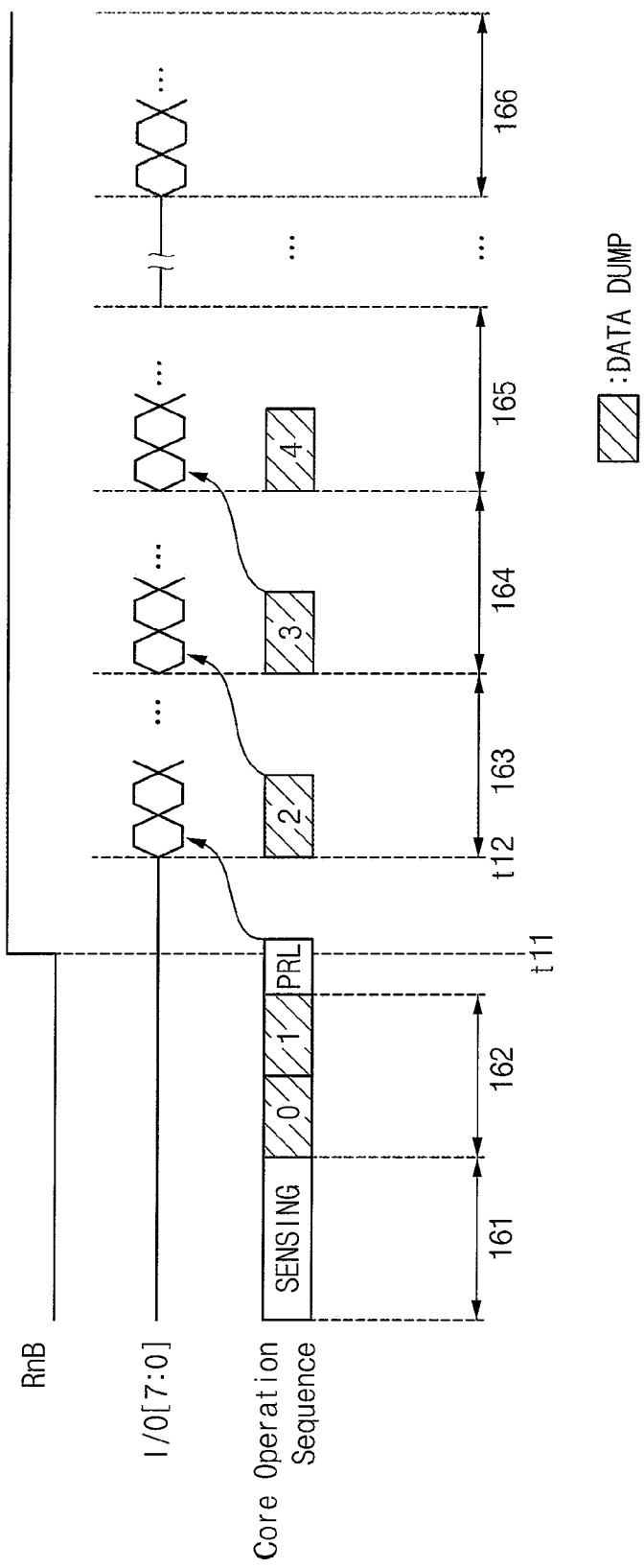
FIG. 15A illustrates an example operation of the page buffer circuit according to example embodiments.

FIG. 15A illustrates an example operation of the page buffer circuit according to example embodiments.

Referring to FIGS. 1, 5, 6 and 15A together, in a data sensing period 161, the first through eighth page buffer units PBU0 through PBU7 sense data stored in the memory cells through the bit-lines BLs and store the sensed data in respective ones of sensing latches. In a data transfer period 162, the sensed data are sequentially dumped from sensing latches of the first and second page buffer units PBO0 and PBU1 to the first and second cache latches CL0 and CL1. The data sequentially dumped to the first and second cache latches CL0 and CL1 are sequentially moved to the register 270 (PRL in FIG. 15A corresponds to the register 270) based on a column address C_ADDR which is selected in data output operation and is provided to an outside of the nonvolatile memory device 10 via the data I/O circuit 250.

The status generator 225 in the control circuit 220 transitions the status signal RnB from a logic low level to a logic high level at a first time point t11 after sequential dumping data to the first and second cache latches CL0 and CL1 is completed. After transitioning the status signal RnB from a logic low level to a logic high level, the data sequentially dumped to the first and second cache latches CL0 and CL1 are output in parallel via the data I/O line I/O[7:0] at a second time point t12. In a period 163 in which the data are output in parallel via the data I/O line I/O[7:0], data is dumped from the third page buffer unit PB2 to the third cache unit CL2.

In a period 164 in which the data dumped to the third cache unit CL2 is output via the data I/O line I/O[7:0], data is dumped from the fourth page buffer unit PB3 to the fourth cache unit CL3. In a period 165 in which the data dumped to the fourth cache unit CL3 is output via the data I/O line I/O[7:0], data is dumped from the fifth page buffer unit PB4 to the fifth cache unit CL4. In a period 166, data dumped to the eighth cache latch CL7 before the period 167, is output via the data I/O line I/O[7:0].

In some example embodiments, when it is assumed that 18 KB of data are stored in the first through eighth page buffer units PBU0 through PBU7, 2.25 KB of data are dumped to the first cache latch CL0 and 2.25 KB of data are dumped from the second page buffer unit PBU1 to the second cache latch CL1 while the 2.25 KB of data dumped to the first cache latch CL0 are output via the data I/O line I/O[7:0] through the register 270 sequentially based on the column address C_ADDR.

Figure 15B:
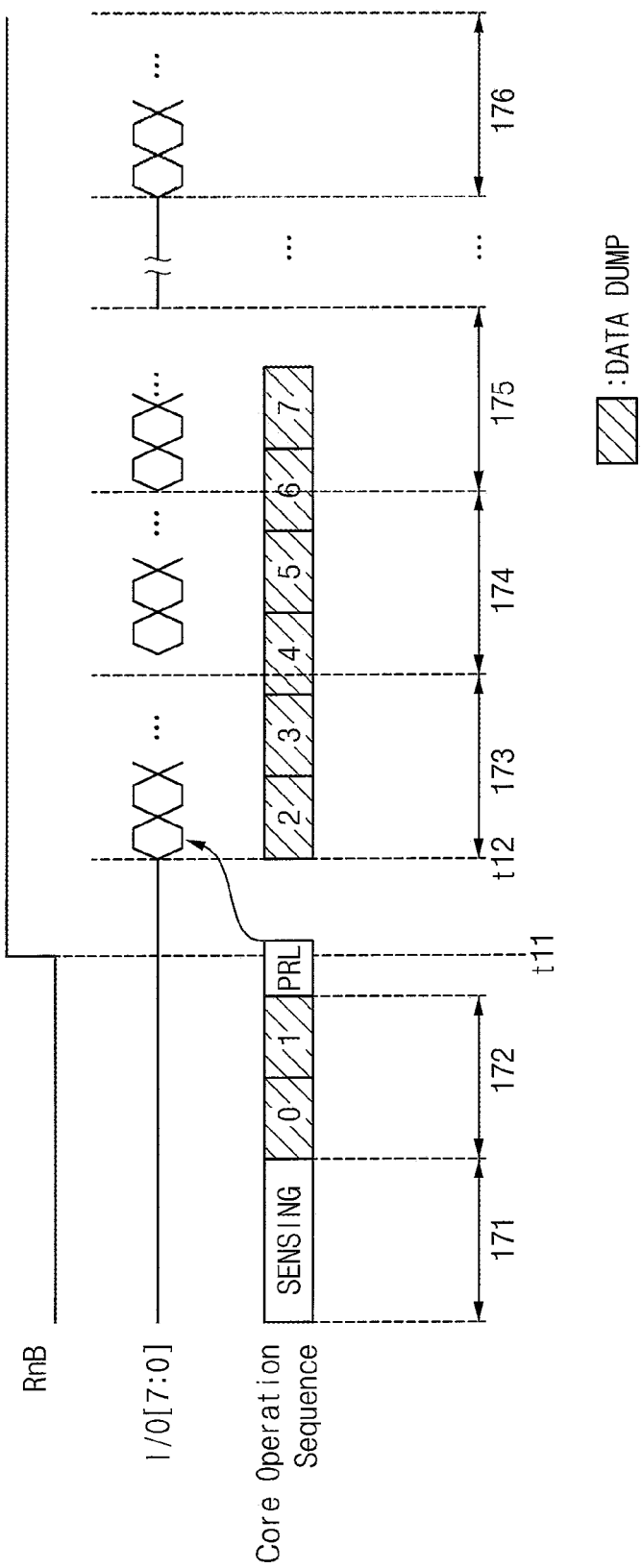
FIG. 15B illustrates an example operation of the page buffer circuit according to example embodiments.

FIG. 15B illustrates an example operation of the page buffer circuit according to example embodiments.

Referring to FIGS. 1, 5, 6 and 15B together, in a data sensing period 171, the first through eighth page buffer units PBU0 through PBU7 sense data stored in the memory cells through the bit-lines BLs and store the sensed data in respective ones of sensing latches. In a data transfer period 172, the sensed data are sequentially dumped from sensing latches of the first and second page buffer units PBO0 and PBU1 to the first and second cache latches CL0 and CL1. The data sequentially dumped to the first and second cache latches CL0 and CL1 are sequentially moved to the register 270 (PRL in FIG. 15B corresponds to the register 270) based on a column address C_ADDR which is selected in data output operation and is provided to an outside of the nonvolatile memory device 10 via the data I/O circuit 250.

The status generator 225 in the control circuit 220 transitions the status signal RnB from a logic low level to a logic high level at a first time point t11 after sequential dumping data to the first and second cache latches CL0 and CL1 is completed. After transitioning the status signal RnB from a logic low level to a logic high level, the data sequentially dumped to the first and second cache latches CL0 and CL1 are output in parallel via the data I/O line I/O[7:0] at a second time point t12. In each of periods 173, 174 and 175 in which the data are output in parallel via the data I/O line I/O[7:0], data is sequentially dumped from each of the third through eighth page buffer units PB2 through PB7 to respective ones of the third through eighth cache units CL2 through CL7.

In each of periods 174, 175, 176, the data is sequentially dumped to the third through eighth cache units CL2 through CL7 is output via the data I/O line I/O[7:0].

FIG. 16 illustrates a configuration of data I/O lines corresponding to one mat according to example embodiments.

Referring to FIG. 16, a mat MAT may include even I/O lines Even corresponding to even bit-lines and odd I/O lines Odd corresponding to odd bit-lines. The even I/O lines Even may include a column redundancy region CR1 between sub groups SG11 and SG12 and sub groups SG13 and SG14. The odd I/O lines Odd may include a column redundancy region CR2 between sub groups SG21 and SG22 and sub groups SG23 and SG24.

The sub group SG12 may include eight data I/O lines I/O_0 through I/O_7. The data dumped to the first through eighth cache latches CL0 through CL7 in FIG. 5 are sequentially output through the eight data I/O lines I/O_0 through I/O_7. Since the data dumped to the first cache latches CL0 is simultaneously output through the eight data I/O lines I/O_0 through I/O_7 in parallel, the operation described with reference to FIG. 15A is possible.

FIG. 17 illustrates mapping relation between a burst length and a column address in the page buffer circuit according to example embodiments.

In FIG. 17, it is assumed that the page buffer units and the cache latches corresponding to the page buffer units are configured with 8 stages.

Referring to FIG. 17, when the column address C_ADDR sequentially increments, the cache latches in one stage may be consecutively selected. Accordingly, after dumping data stored in the page buffer unit in one stage, 2.25 KB of data may be consecutively outputted. However, when the column address C_ADDR sequentially increments and a stage including the selected page buffer unit is continuously changed, normal data output operation is secured when data dumping operation with respect to the selected page buffer unit is finished. According to example embodiments, while the column address increments by 2.25K, a correlation between a burst length number BL_NO and the column address C_ADDR such that the page buffer unit in one stage is consecutively selected, the data output operation may begin after minimum data dumping operation is completed. Therefore, read interval of the nonvolatile memory device 10 may be reduced.

Figure 18:
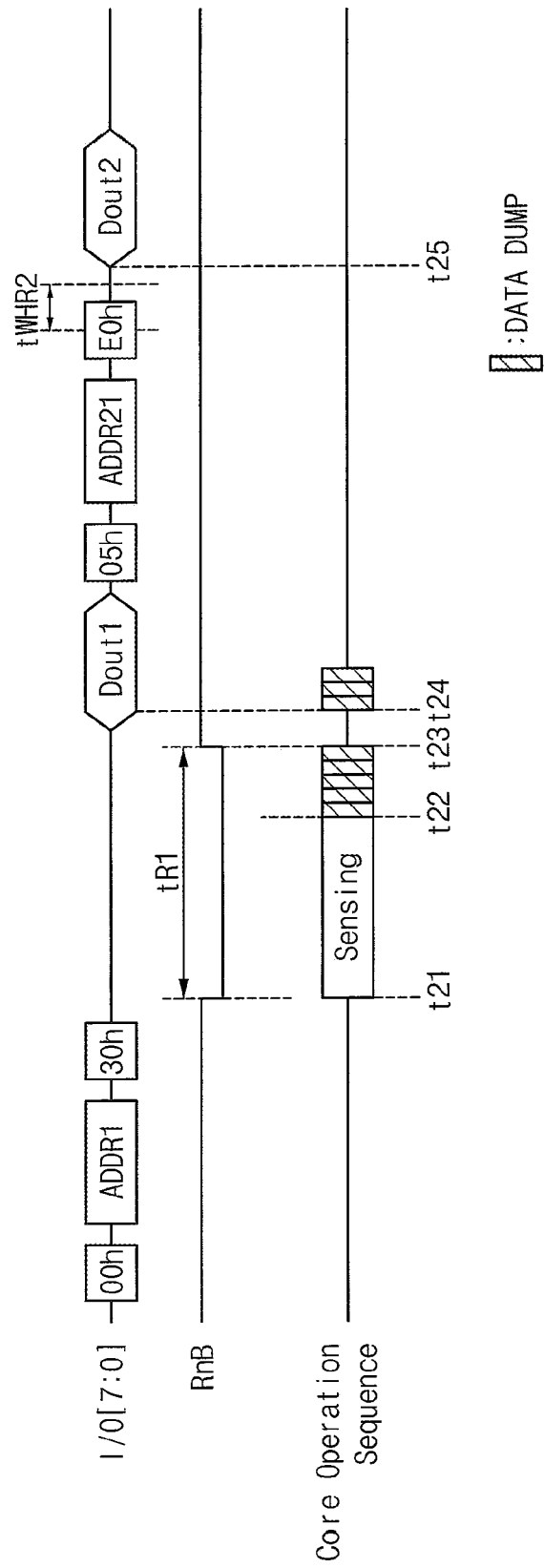
FIG. 18 is a timing diagram illustrating an operation of the nonvolatile memory device according to example embodiments.

FIG. 18 is a timing diagram illustrating an operation of the nonvolatile memory device according to example embodiments.

Referring to FIGS. 1, 3, 5 and 18, the memory controller 40 provides a read command sequence (a first command sequence) 00h-ADDR1-30h including a first address ADDR1 to the nonvolatile memory device 10 during the status signal RnB having a logic high level indicating a ready state. When the nonvolatile memory device 10 receives the read command sequence 00h-ADDR1-30h, the control circuit 220 transitions the status signal RnB to a logic low level indicating a busy state at a time point t21. From the time point t21 to a time point t22, the page buffer circuit 210 senses data from selected memory cells and latches the sensed data to the page buffer units. From the time point t22 to a time point t23, each of the page buffer units PB0 through PB4 in the page buffer circuit 210 sequentially dumps the latched data to respective ones of corresponding cache latches CL0~CL4 (a first data transfer operation).

The control circuit 220 transitions the status signal RnB to a logic high level at the time point t23. The data may be outputted from a time point when the status signal RnB transitions to a logic high level. While the page buffer circuit 210 outputs the data dumped to the cache latches CL0~CL4 (a first data output operation Dout1), the page buffer circuit 210 sequentially dumps latched data in each of the page buffer units PBU5 through PBU7 to respective ones of corresponding cache latches CL5~CL7 (a second data transfer operation) from a time point t24.

The memory controller 40 provides a random data output command sequence (a second command sequence) 05h-ADDR21-E0h including a second address ADDR21 to the nonvolatile memory device 10 during the status signal RnB having a logic high level. Since the data are dumped to the cache latches CL5~CL7 at the time point t24, the page buffer circuit 210 may output the data dumped to the cache latches CL5~CL7 through the data I/O circuit 250 (a second data output operation Dout2) at a time point t25 after a time interval tWHR2 elapses from a time point at which the nonvolatile memory device 10 receives the random data output command sequence 05h-ADDR21-E0h without regard to whether column addresses in the first address ADDR1 and the second address ADDR21 belong to consecutive address space.

In FIG. 18, a time interval from the tome point t21 to the time point t23 corresponds to a read time interval tR1.

Figure 19:
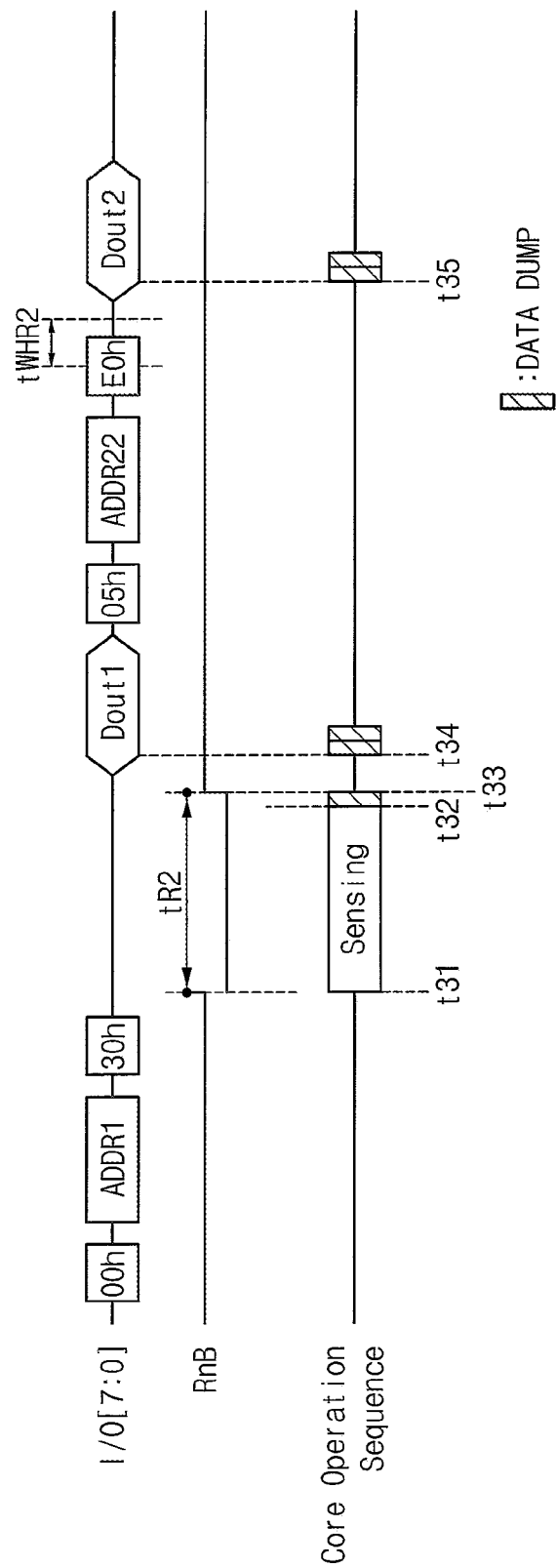
FIG. 19 is a timing diagram illustrating an operation of the nonvolatile memory device according to example embodiments.

FIG. 19 is a timing diagram illustrating an operation of the nonvolatile memory device according to example embodiments.

Referring to FIGS. 1, 3, 5 and 19, the memory controller 40 provides a read command sequence (a first command sequence) 00h-ADDR1-30h including a first address ADDR1 to the nonvolatile memory device 10 during the status signal RnB having a logic high level indicating a ready state. When the nonvolatile memory device 10 receives the read command sequence 00h-ADDR1-30h, the control circuit 220 transitions the status signal RnB to a logic low level indicating a busy state at a time point t31. From the time point t31 to a time point t32, the page buffer circuit 210 senses data from selected memory cells and latches the sensed data to the page buffer units. From the time point t32 to a time point t33, the page buffer unit PB0 in the page buffer circuit 210 dumps the latched data to the cache latch CL0 (a first data transfer operation).

The control circuit 220 transitions the status signal RnB to a logic high level at the time point t33. The data may be outputted from a time point when the status signal RnB transitions to a logic high level. While the page buffer circuit 210 outputs the data dumped to the cache latch CL0 (a first data output operation Dout1), the page buffer circuit 210 sequentially dumps latched data in each of the page buffer units PBU1 and PBU2 to respective ones of corresponding cache latches CL1 and CL2 (a second data transfer operation) from a time point t34.

The memory controller 40 provides a random data output command sequence (a second command sequence) 05h-ADDR21-E0h including a second address ADDR22 to the nonvolatile memory device 10 during the status signal RnB having a logic high level. The column addresses in the second address ADDR22 are consecutive with respect to the column addresses in the first address ADDR1. That is, the column addresses in the first address ADDR1 and the second address ADDR22 belong to the consecutive address space. Since the column addresses in the first address ADDR1 and the second address ADDR22 are consecutive, while the page buffer circuit 210 outputs the data dumped to the cache latches CL1 and CL2 through the data I/O circuit 250 (a second data output operation Dout2) at a time point t35 after a time interval tWHR2 elapses from a time point at which the nonvolatile memory device 10 receives the random data output command sequence 05h-ADDR21-E0h, the page buffer circuit 210 sequentially dumps data latched in the page buffer unit PBU3 and PBU4 to the cache latches CL3 and CL4 (a third data transfer operation).

In FIG. 19, a time interval from the tome point t31 to the time point t33 corresponds to a read time interval tR2 and the read time interval tR2 may be smaller than the read time interval tR1 in FIG. 18.

Figure 20:
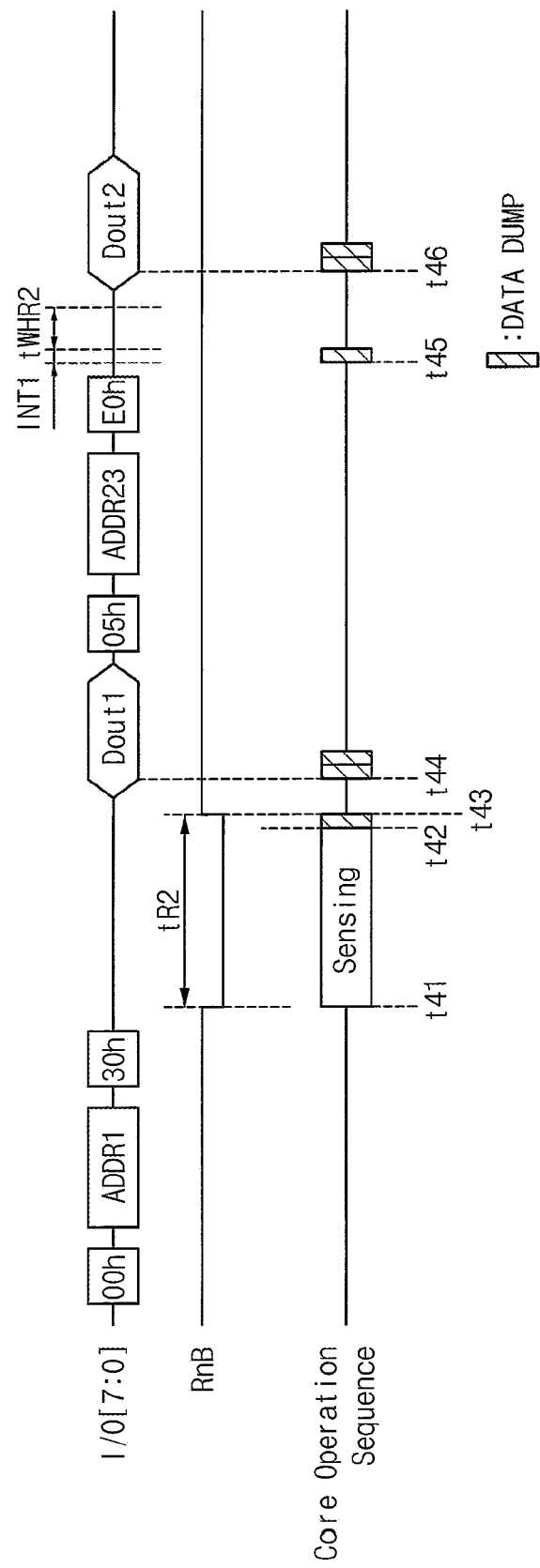
FIG. 20 is a timing diagram illustrating an operation of the nonvolatile memory device according to example embodiments.

FIG. 20 is a timing diagram illustrating an operation of the nonvolatile memory device according to example embodiments.

Referring to FIGS. 1, 3, 5 and 20, the memory controller 40 provides a read command sequence (a first command sequence) 00h-ADDR1-30h including a first address ADDR1 to the nonvolatile memory device 10 during the status signal RnB having a logic high level indicating a ready state. When the nonvolatile memory device 10 receives the read command sequence 00h-ADDR1-30h, the control circuit 220 transitions the status signal RnB to a logic low level indicating a busy state at a time point t41. From the time point t41 to a time point t42, the page buffer circuit 210 senses data from selected memory cells and latches the sensed data to the page buffer units. From the time point t42 to a time point t43, the page buffer unit PB0 in the page buffer circuit 210 dumps the latched data to the cache latch CL0 (a first data transfer operation).

The memory controller 40 provides a random data output command sequence (a second command sequence) 05h-ADDR21-E0h including a second address ADDR22 to the nonvolatile memory device 10 during the status signal RnB having a logic high level. The column addresses in the second address ADDR22 are non-consecutive with respect to the column addresses in the first address ADDR1. That is, the column addresses in the first address ADDR1 and the second address ADDR22 belong to the non-consecutive address space. Since the column addresses in the first address ADDR1 and the second address ADDR22 are non-consecutive, the page buffer circuit 210 dumps data latched in the page buffer unit PBU3 to the cache latch CL3 (a third data transfer operation) at a time point t45 after the nonvolatile memory device 10 receives the random data output command sequence 05h-ADDR21-E0h. After a time interval INT1 and a time interval tWHR2 elapses from the time point t45, while the page buffer circuit 210 outputs the data dumped to the cache latches CL1, CL2 and CL3 through the data I/O circuit 250 (a second data output operation Dout2), the page buffer circuit 210 sequentially dumps data latched in the page buffer unit PBU4 and PBU5 to the cache latches CL4 and CL5 (a fourth data transfer operation).

In FIG. 20, a time interval from the tome point t41 to the time point t43 corresponds to a read time interval tR2 and the read time interval tR2 may be smaller than the read time interval tR1 in FIG. 18.

In FIGS. 18 through 20, a description on determining whether the column addresses are consecutive is provided, assuming that total column addresses covers 16 KB of address space, the 16 KB of address space is divided into first through fourth column address spaces and each of the first through fourth column address spaces covers 4 KB of address space. When the column addresses in the read command sequence belong to the first column address space and the column addresses in the random data output command sequence corresponding to column addresses belonging to the second column address space, the column addresses in the first address and the second address are determined as consecutive. When the column addresses in the read command sequence belong to the first column address space and the column addresses in the random data output command sequence corresponding to column addresses not belonging to the second column address space, the column addresses in the first address and the second address are determined as non-consecutive.

In FIGS. 18 through 20, the first data transfer operation may be performed by a portion of page buffer units which are selected from a plurality of page buffer units in the page buffer circuit 210 based on first column addresses included in the first address ADDR1. The page buffer circuit 210 simultaneously performs the data transfer operation (data dump operation) and the data output operation and thus may reduce read time interval associated with read operation.

In FIGS. 18 through 20, it is described as the nonvolatile memory device 10 receives the random data output command sequence 05h-ADDR21-E0h after performing the first data output operation Dout1. However, in some example embodiments, the nonvolatile memory device 10 receives the random data output command sequence 05h-ADDR21-E0h before performing the first data output operation Dout1. In some example embodiments, the column address designated by the random data output command sequence 05h-ADDR21-E0h is the same as the column address in the read command sequence received prior to the random data output command sequence 05h-ADDR21-E0h and the nonvolatile memory device 10 receives random data output command sequence designating another column address space.

Figure 21:
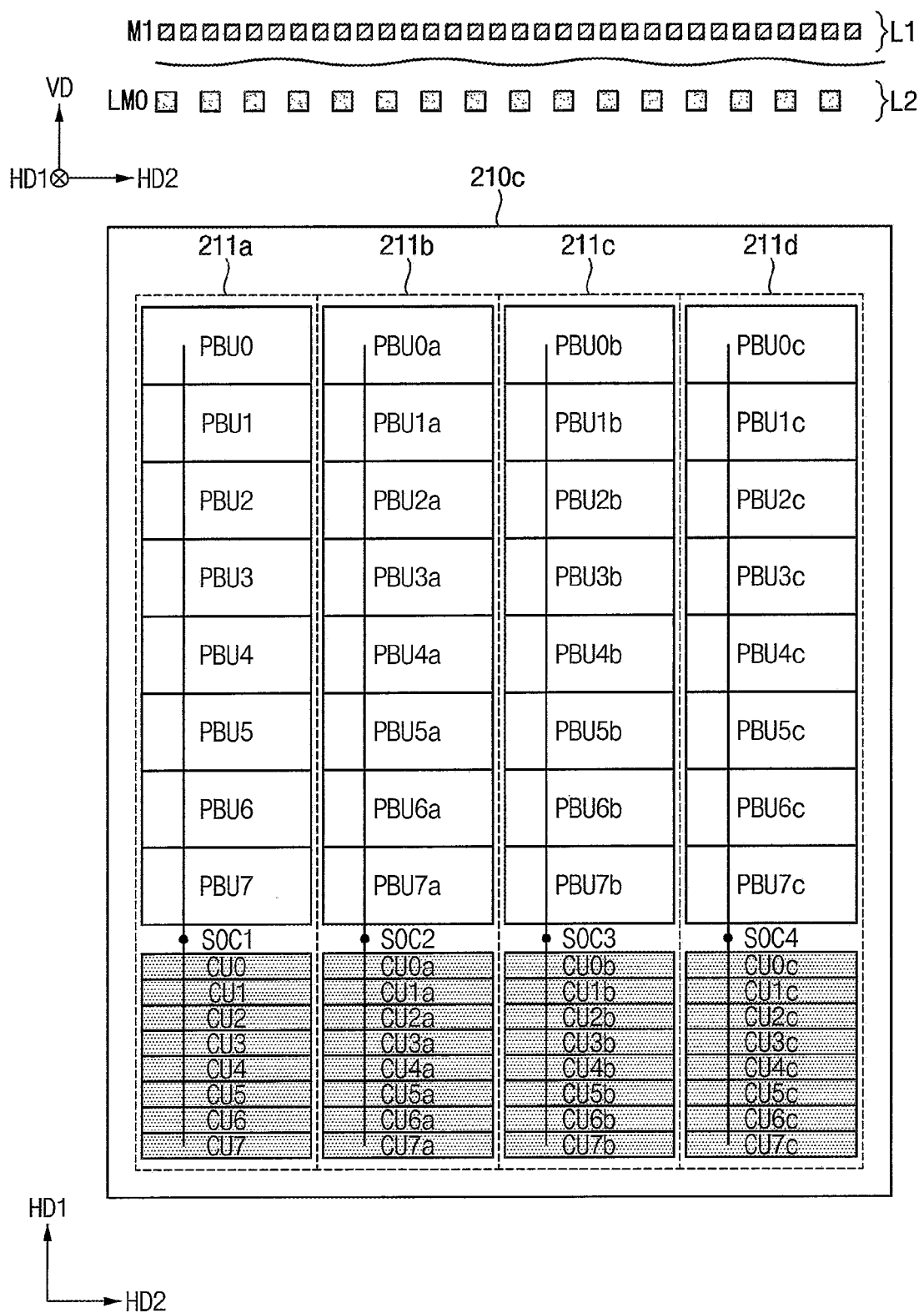
FIG. 21 illustrates an arrangement of the first through eighth page buffer units and the first through eighth cache units in a page buffer circuit, according to example embodiments.

FIG. 21 illustrates an arrangement of the first through eighth page buffer units and the first through eighth cache units in a page buffer circuit, according to example embodiments.

Referring to FIGS. 3 and 21 together, the first semiconductor layer L1 may include the first metal layer M1 extending in the first horizontal direction HD1, and the plurality of bit-lines BL may be implemented as the first metal layer M1. The second semiconductor layer L2 may include the first lower metal layer LM0 extending in the first horizontal direction HD1. In some example embodiments, the pitch of the first lower metal layer LM0 may be greater than the pitch of the first metal layer M1. In some example embodiments, the pitch of the first lower metal layer LM0 may be approximately twice the pitch of the first metal layer M1.

The second semiconductor layer L2 may include a page buffer circuit 210c, and the page buffer circuit 210c may be implemented in a form of a page buffer array including a plurality of columns 211a through 211d in the second horizontal direction HD2. Each of the plurality of columns 211a through 211d may include first through eighth page buffer units PBU0 through PBU7 and the first through eighth cache units CU0 through CU7. In some example embodiments, the configuration of each of the plurality of columns 211a through 211d may correspond to the page buffer circuit 210a illustrated in FIGS. 9 and 10A. As a width of a transistor decreases, and a size of the first through eighth page buffer units PBU0 through PBU7 in the second horizontal direction HD2 decrease, the page buffer circuit 210c may arrange more page buffer units in the same row, and accordingly, the page buffer circuit 210c may include a plurality of columns 211a through 211d.

The first column 211a may include a first main region and a first cache region in the first horizontal direction HD1, the first through eighth page buffer units PBU0 through PBU7 may be in the first main region, and the first through eighth cache units CU0 through CU7 may be in the first cache region. The second column 211b may include a second main region and a second cache region in the first horizontal direction HD1, first through eighth page buffer units PBU0a through PBU7a may be in the second main region, and first through eighth cache units CU0a through CU7a may be in the second cache region. The third column 211c may include a third main region and a third cache region in the first horizontal direction HD1, first through eighth page buffer units PBU0b through PBU7b may be in the third main region, and first through eighth cache units CU0b through CU7b may be in the third cache region. The fourth column 211d may include a fourth main region and a fourth cache region in the first horizontal direction HD1, first through eighth page buffer units PBU0c through PBU7c may be in the fourth main region, and first through eighth cache units CU0c through CU7c may be in the fourth cache region.

In the first column 211a, sensing nodes of each of the first through eighth page buffer units PBU0 through PBU7 may be commonly connected to a first combined sensing node SOC1, and the first to eighth cache units CU0 to CU7 may be commonly connected to the first combined sensing node SOC1. In the second column 211b, sensing nodes of each of the first through eighth page buffer units PBU0a through PBU7a may be commonly connected to a second combined sensing node SOC2, and the first to eighth cache units CU0a through CU7a may be commonly connected to the second combined sensing node SOC2. In the third column 211c, sensing nodes of each of the first through eighth page buffer units PBU0b through PBU7b may be commonly connected to a third combined sensing node SOC3, and the first to eighth cache units CU0b through CU7b may be commonly connected to the third combined sensing node SOC3. In the fourth column 211d, sensing nodes of each of the first through eighth page buffer units PBU0c through PBU7c may be commonly connected to a fourth combined sensing node SOC4, and the first to eighth cache units CU0c through CU7c may be commonly connected to the fourth combined sensing node SOC4.

Figure 22:
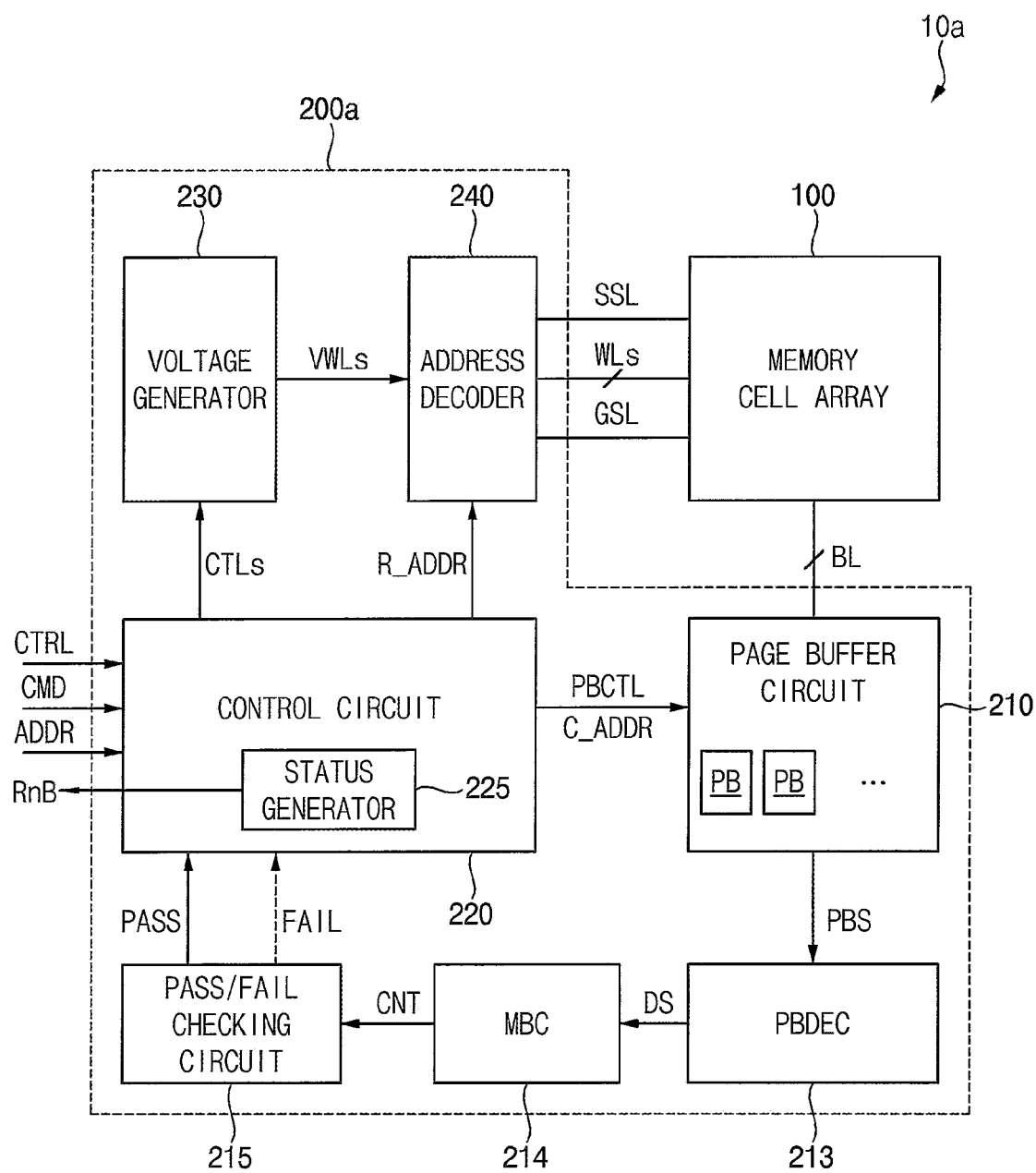
FIG. 22 is a block diagram illustrating a nonvolatile memory device according to example embodiments.

FIG. 22 is a block diagram illustrating a nonvolatile memory device according to example embodiments.

Referring to FIG. 22, a nonvolatile memory device 10a may include the memory cell array 100 and a peripheral circuit 200a. The nonvolatile memory device 10a may correspond to a modified example of the nonvolatile memory device 10 of FIG. 1, and descriptions given with reference to FIGS. 1 through 21 may also be applied to the present embodiments.

Compared with the nonvolatile memory device 10 of FIG. 1, the peripheral circuit 200a may further include a page buffer decoder (PBDEC) 213, an MBC 214, and a pass/fail checking circuit 215.

The PBDEC 213 may generate a decoder output signal DS corresponding to the number of fail bits by using a page buffer signal PBS received from the page buffer circuit 210. In some example embodiments, when the page buffer signal PBS is a logic low level, a program for the corresponding memory cell may be determined as being failed and data programmed to the corresponding memory cell may be determined as a fail bit. The PBDEC 213 may receive a reference current from a current generator (not illustrated), and generate the decoder output signal DS based on the received reference current.

The MBC 214 may receive the decoder output signal DS from the PBDEC 213, and may generate a count result CNT from the decoder output signal DS. In some example embodiments, the MBC 214 may include an analog-to-digital converter that converts the decoder output signal DS of an analog-level to the count result CNT that is a digital value. The MBC 214 may receive a reference current from a current generator (not illustrated), and generate the count result CNT based on the received reference current.

The pass/fail checking circuit 215 may receive the count result CNT from the MBC 214, may generate a pass signal PASS or fail signal FAIL based on the count result CNT, and may provide the generated pass signal PASS or fail signal FAIL to the control circuit 220. In some example embodiments, when the count result CNT is less than or equal to the reference number, the pass/fail checking circuit 215 may generate the pass signal PASS. In some example embodiments, when the count result CNT is greater than the reference number, the pass/fail checking circuit 215 may generate the fail signal FAIL.

Figure 23:
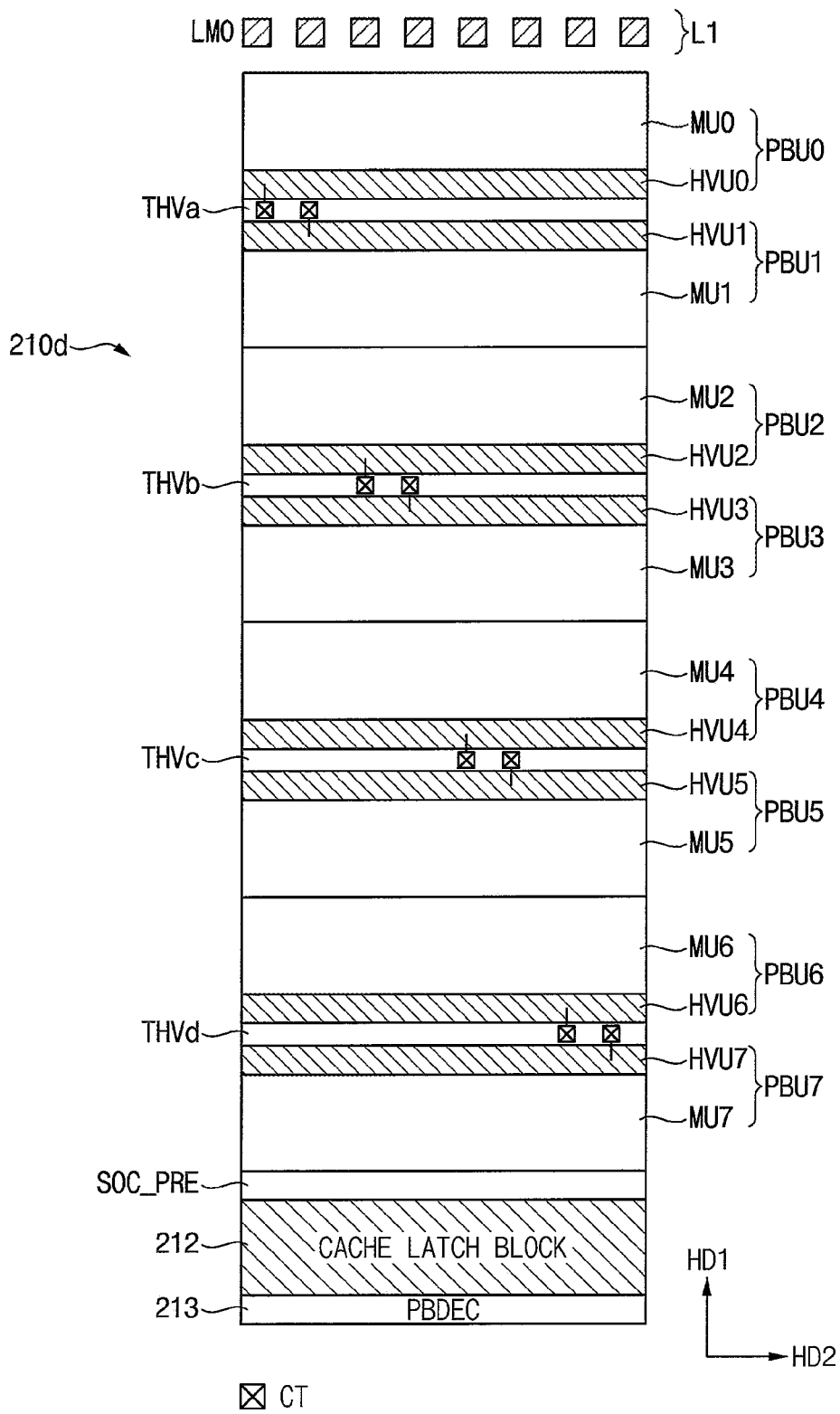
FIG. 23 is a plan view illustrating a page buffer circuit and the page buffer decoder (PBDEC) according to example embodiments.

FIG. 23 is a plan view illustrating a page buffer circuit and the page buffer decoder (PBDEC) according to example embodiments.

Referring to FIGS. 3 and 23 together, the first semiconductor layer L1 may include first through eighth bit-lines BL1 through BL8 extending in the first horizontal direction HD1, and the first through eighth bit-lines BL0 through BL7 may be implemented as a first metal layer M1. In some example embodiments, a size of a page buffer circuit 210d in the second horizontal direction HD2 may correspond to an arrangement area of the first through eighth bit-lines BL0 through BL7, and accordingly, the page buffer circuit 210d may include page buffers of eight stages. The page buffer circuit 210d may correspond to a modified example of the page buffer circuit 210a illustrated in FIGS. 9 and 10A and descriptions given with reference to FIGS. 9 through 22 may also be applied to the present embodiments.

The page buffer circuit 210d may include the first through eighth page buffer units PBU0 through PBU7 in the first horizontal direction HD1, and each of the first through eighth page buffer units PBU0 through PBU7 may include a main unit and a high voltage unit. In some example embodiments, the first page buffer unit PBU0 may include a first main unit MU0 and a first high voltage unit HVU0 in the first horizontal direction HD1.

The page buffer circuit 210d may further include the plurality of contact regions THVa through THVd. In some example embodiments, the first contact region THVa may be between the first page buffer unit PBU0 and the second page buffer unit PBU1, and in the first contact region THVa, the first bit-line contact CT0 connected to the first bit-line BL0 and a second bit-line contact CT1 connected to the second bit-line BL1 may be arranged. The first bit-line contact CT0 may be connected to a high voltage transistor included in the first high voltage unit HVU0 (for example, TR_hv in FIG. 6), and the second bit-line contact CT1 may be connected to a high voltage transistor included in a second high voltage unit HVU1.

The page buffer circuit 210d may further include a cache latch block 212, and the cache latch block 212 may include first through eighth cache latches (for example, CL0 through CLn in FIG. 5) corresponding to the first through eighth page buffer units PBU0 through PBU7, respectively. The page buffer circuit 210d may further include the combined sensing node precharge circuit SOC_PRE between the eighth page buffer unit PBU7 and the cache latch block 212.

Alternatively or additionally, the PBDEC 213 may be adjacent to the page buffer circuit 210d in the first horizontal direction HD1. The PBDEC 213 may determine the number of pass cells and fail cells during the program verification operation. In some example embodiments, the PBDEC 213 may include a plurality of transistors connected between the cache latches and global data lines. In some example embodiments, when the data dumping operation is performed from the S-LATCHs SL of each of the first through eighth page buffer units PBU0 through PBU7 to the PBDEC 213, the pass control signal SO_PASS[7:0]) may be activated, and the first and second pass transistors may be turned on. Accordingly, the sensing node lines and the combined sensing node lines may be used as data transfer lines, the data dumping operation may be sequentially performed between the S-LATCHs SL of the first through eighth page buffer units PBU0 through PBU7 and the PBDEC 213 and the data dumping operation may be partially overlapped with data output operation.

FIG. 24 illustrates a page buffer circuit and the PBDEC according to example embodiments.

Referring to FIG. 24, a page buffer circuit 210e may have a multi-stage structure in which a plurality of page buffers are in the first horizontal direction HD1, in some example embodiments, an 8-stage structure including first through eighth stages STAGE0 through STAGE7. Alternatively or additionally, in the page buffer circuit 210e, a plurality of columns including first and second columns 211a and 211b may be in the second horizontal direction HD2.

The PBDEC 213 may include a plurality of page buffer decoders including first and second PBDECs 213a and 213b connected to the first and second columns 211a and 211b included in the page buffer circuit 210e, respectively. The first PBDEC 213a may include an inverter 213a1 and serially-connected transistors N01, N02, and N03, and the second PBDEC 213b may include an inverter 213b1 and serially-connected transistors N0a1, N0a2, and N0a3. Each of the inverters 213a1 and 213b1 may receive a page buffer signal from a corresponding column, and a reference current signal REF_CUR may be applied to a gate of each of the transistors N03 and N0a3.

In some example embodiments, the first and second PBDECs 213a and 213b may include first and second page buffer signals PBS1 and PBS2 from the page buffer units PBU0 and PBU0a included in the first stage STAGE0, respectively. In some example embodiments, when a memory cell connected to the page buffer unit PBU0 is determined as a program failed cell, a logic low level may be stored in the S-LATCH SL of the page buffer unit PBU0. In some example embodiments, the first page buffer signal PBS1 may be a logic low level that is a voltage level of the first sensing node SO0, and the voltage level of the first combined sensing node SOC1 may also be a logic low level. In some example embodiments, the inverter 213a1 may output a logic high level signal, and accordingly, the transistor N01 may be turned on, and then, the first PBDEC 213a may operate as a current sink.

The transistor N03 may output a first signal, that is, a reference current, to a wired OR terminal WOR_OUT based on the reference current signal REF_CUR. In some example embodiments, the reference current may correspond to a current flowing through the transistor N03 when the transistor N03 is turned on according to the reference current signal REF_CUR. Similarly, the transistor N0a3 may output a second signal, that is, a reference current, to a wired OR terminal WOR_OUT based on the reference current signal REF_CUR. The wired OR terminal WOR_OUT may be commonly connected to the first and second PBDECs 213a and 213b, and accordingly, the first and second signals output from the first and second PBDECs 213a and 213b may be accumulated in the wired OR terminal WOR_OUT and generated as the decoder output signal DS. In some example embodiments, the decoder output signal DS may correspond to a current signal IWOR flowing through the wired OR terminal WOR_OUT.

Figure 25:
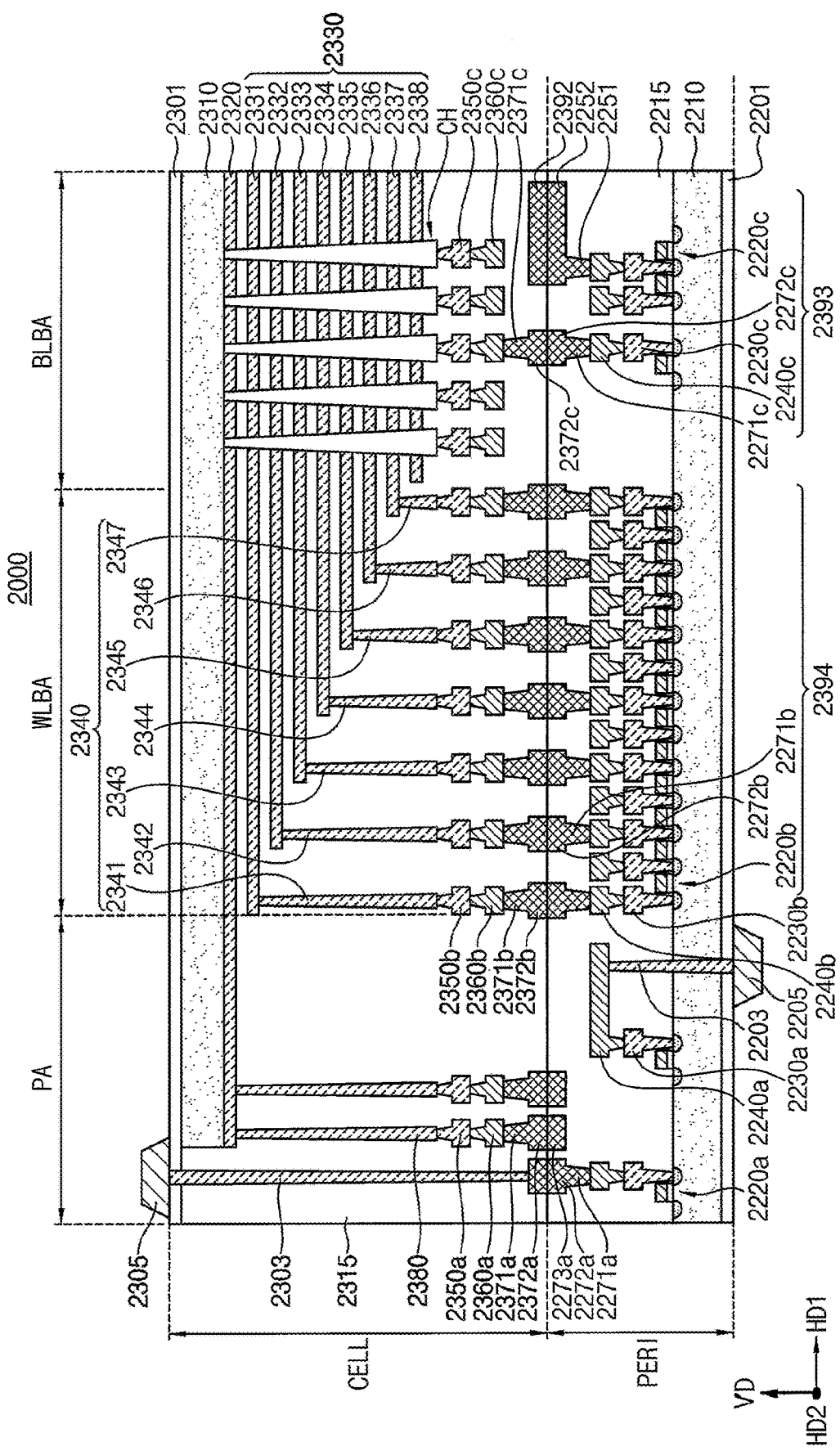
FIG. 25 is a cross-sectional view of a nonvolatile memory device according to example embodiments.

FIG. 25 is a cross-sectional view of a nonvolatile memory device according to example embodiments.

Referring to FIG. 25, a nonvolatile memory device or a memory device 2000 may have a chip-to-chip (C2C) structure. The C2C structure may refer to a structure formed by manufacturing/fabricating an upper chip including a memory cell region or a cell region CELL on a first wafer, manufacturing/fabricating a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. In some example embodiments, when the bonding metals may include copper (Cu) using a Cu-to-Cu bonding. The example embodiments, however, may not be limited thereto. In some example embodiments, the bonding metals may also be formed of aluminum (Al) and/or tungsten (W).

Each of the peripheral circuit region PERI and the cell region CELL of the memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c connected to the plurality of circuit elements 2220a, 2220b, and 2220c, and second metal layers 2240a, 2240b, and 2240c formed on the first metal layers 2230a, 2230b, and 2230c, respectively. In some example embodiments, the first metal layers 2230a, 2230b, and 2230c may be formed of tungsten having relatively high electrical resistivity, and the second metal layers 2240a, 2240b, and 2240c may be formed of copper having relatively low electrical resistivity.

In some example embodiments illustrated in FIG. 25, although only the first metal layers 2230a, 2230b, and 2230c and the second metal layers 2240a, 2240b, and 2240c are shown and described, the example embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word-line bonding area WLBA. In the word-line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, and/or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of word-lines 2331, 2332, 2333, 2334, 2335, 2336, 2337, and 2338 (e.g., 2330) may be stacked in a third direction D3 (e.g., a Z-axis direction), perpendicular to an upper surface of the second substrate 2310. At least one string selection line and at least one ground selection line may be arranged on and below the plurality of word-lines 2330, respectively, and the plurality of word-lines 2330 may be disposed between the at least one string selection line and the at least one ground selection line.

In the bit-line bonding area BLBA, a channel structure CH may extend in the third direction D3 (e.g., the Z-axis direction), perpendicular to the upper surface of the second substrate 2310, and pass through the plurality of word-lines 2330, the at least one string selection line, and the at least one ground selection line. The channel structure CH may include a data storage layer, a channel layer, a buried insulating layer, and the like, and the channel layer may be electrically connected to a first metal layer 2350$c$ and a second metal layer 2360$c$. In some example embodiments, the first metal layer 2350$c$ may be a bit-line contact, and the second metal layer 2360$c$ may be a bit-line. In some example embodiments, the bit-line 2360$c$ may extend in a second direction HD2 (e.g., a Y-axis direction), parallel to the upper surface of the second substrate 2310.

In some example embodiments illustrated in FIG. 23, an area in which the channel structure CH, the bit-line 2360$c$, and the like are disposed may be defined as the bit-line bonding area BLBA. In the bit-line bonding area BLBA, the bit-line 2360$c$ may be electrically connected to the circuit elements 2220$c$ providing a page buffer 2393 in the peripheral circuit region PERI. The bit-line 2360$c$ may be connected to upper bonding metals 2371$c$ and 2372$c$ in the cell region CELL, and the upper bonding metals 2371$c$ and 2372$c$ may be connected to lower bonding metals 2271$c$ and 2272$c$ connected to the circuit elements 2220$c$ of the page buffer 2393.

In the word-line bonding area WLBA, the plurality of word-lines 2330 may extend in a first direction HD1 (e.g., an X-axis direction), parallel to the upper surface of the second substrate 2310 and perpendicular to the second direction HD2, and may be connected to a plurality of cell contact plugs 2341, 2342, 2343, 2344, 2345, 2346, and 2347 (e.g., 2340). The plurality of word-lines 2330 and the plurality of cell contact plugs 2340 may be connected to each other in pads provided by at least a portion of the plurality of word-lines 2330 extending in different lengths in the first direction HD1. A first metal layer 2350$b$ and a second metal layer 2360$b$ may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371$b$ and 2372$b$ of the cell region CELL and the lower bonding metals 2271$b$ and 2272$b$ of the peripheral circuit region PERI in the word-line bonding area WLBA.

The plurality of cell contact plugs 2340 may be electrically connected to the circuit elements 2220$b$ forming a row decoder 2394 in the peripheral circuit region PERI. In some example embodiments, operating voltages of the circuit elements 2220$b$ forming the row decoder 2394 may be different than operating voltages of the circuit elements 2220$c$ forming the page buffer 2393. In some example embodiments, operating voltages of the circuit elements 2220$c$ forming the page buffer 2393 may be greater than operating voltages of the circuit elements 2220$b$ forming the row decoder 2394.

A common source line contact plug 2380 may be disposed in the external pad bonding area PA. The common source line contact plug 2380 may be formed of a conductive material such as a metal, a metal compound, polysilicon, and/or the like, and may be electrically connected to the common source line 2320. A first metal layer 2350$a$ and a second metal layer 2360$a$ may be stacked on an upper portion of the common source line contact plug 2380, sequentially. In some example embodiments, an area in which the common source line contact plug 2380, the first metal layer 2350$a$, and the second metal layer 2360$a$ are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220$a$, 2220$b$, and 2220$c$ disposed in the peripheral circuit region PERI through a first input/output contact plug 2203, and may be separated from the first substrate 2210 by the lower insulating film 2201. Alternatively or additionally, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220$a$, 2220$b$, and 2220$c$ disposed in the peripheral circuit region PERI through a second input/output contact plug 2303. In some example embodiments, the second input/output pad 2305 is electrically connected to a circuit element 2220$a$.

According to embodiments, the second substrate 2310 and the common source line 2320 may not be disposed in an area in which the second input/output contact plug 2303 is disposed. Also, the second input/output pad 2305 may not overlap the word-lines 2330 in the third direction VD (e.g., the Z-axis direction). The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to embodiments, the first input/output pad 2205 and the second input/output pad 2305 may be selectively formed. In some example embodiments, the memory device 2000 may include only the first input/output pad 2205 disposed on the first substrate 2210 or the second input/output pad 2305 disposed on the second substrate 2310. Alternatively, the memory device 200 may include both the first input/output pad 2205 and the second input/output pad 2305.

A metal pattern provided on an uppermost metal layer may be provided as a dummy pattern (e.g., an electrically inactive pattern) or the uppermost metal layer may be absent, in each of the external pad bonding area PA and the bit-line bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same or similar cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL.

The lower bonding metals 2271b and 2272b may be formed on the second metal layer 2240b in the word-line bonding area WLBA. In the word-line bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bit-line bonding area BLBA, an upper metal pattern 2392, corresponding to a lower metal pattern 2252 formed in the uppermost metal layer of the peripheral circuit region PERI, and having the same or similar cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In some example embodiments, corresponding to a metal pattern formed in an uppermost metal layer in one of the cell region CELL and the peripheral circuit region PERI, a reinforcement metal pattern having the same or similar cross-sectional shape as the metal pattern may be formed in an uppermost metal layer in the other one of the cell region CELL and the peripheral circuit region PERI. A contact may not be formed on the reinforcement metal pattern.

The word-line voltages may be applied to at least one memory block in the cell region CELL through the lower bonding metals 2271b and 2272b in the peripheral circuit region PERI and upper bonding metals 2371b and 2372b of the cell region CELL. Alternatively or additionally, a page buffer circuit formed (provided) in the peripheral circuit region PERI may simultaneously above-mentioned data transfer operation and data output operation.

Figure 26:
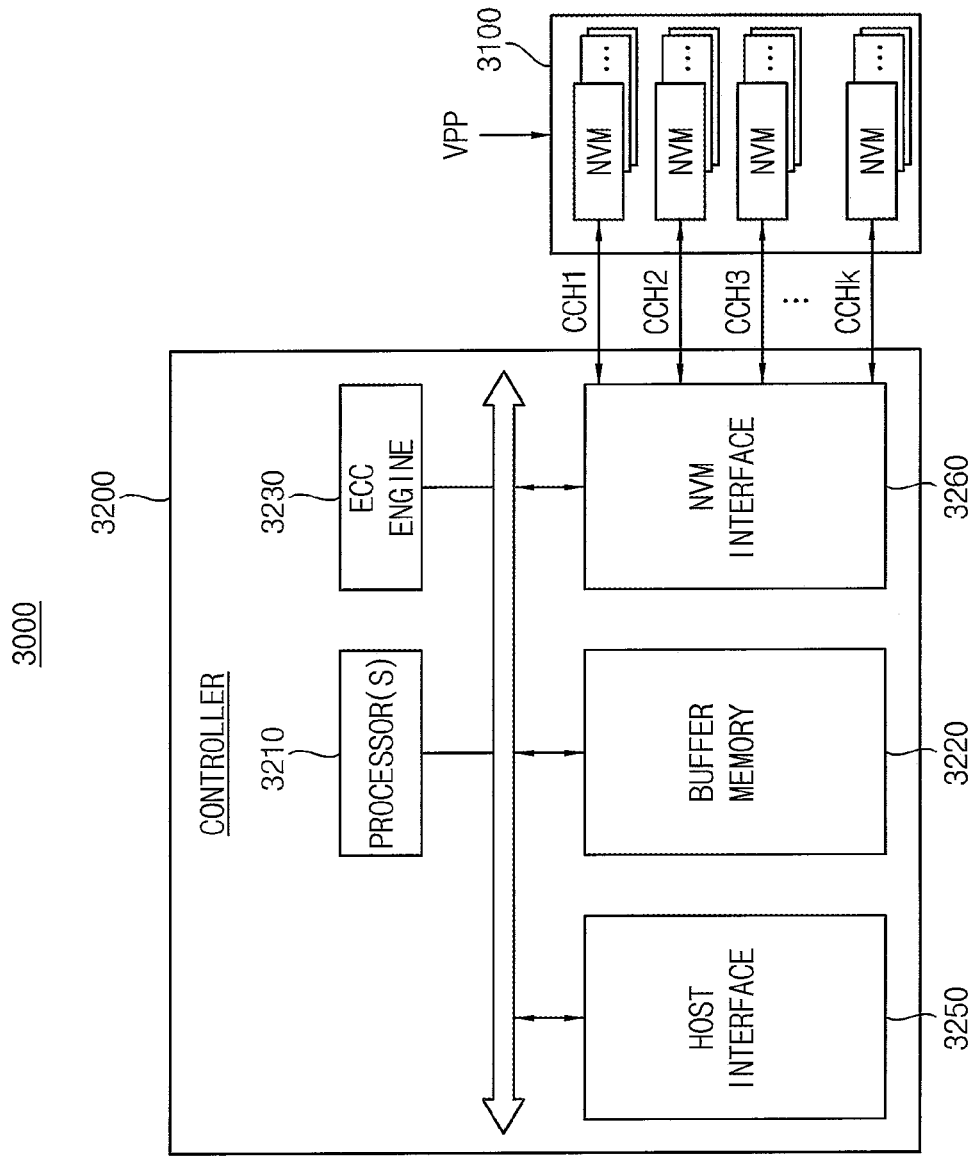
FIG. 26 is a block diagram illustrating a storage device that includes a nonvolatile memory device according to example embodiments.

FIG. 26 is a block diagram illustrating a storage device that includes a nonvolatile memory device according to example embodiments.

Referring to FIG. 26, a storage device 3000 includes a plurality of nonvolatile memory devices 3100 and a controller 3200. In some example embodiments, the storage device 3000 may be any storage device such as an embedded multimedia card (eMMC), a universal flash storage (UFS), a solid state disc or solid state drive (SSD), etc.

The controller 3200 may be connected to the nonvolatile memory devices 3100 via a plurality of channels CCH1, CCH2, CCH3, . . . , CCHk (k being a positive integer). The controller 3200 may include one or more processors 3210, a buffer memory 3220, an error correction code (ECC) engine 3230, a host interface 3250 and a nonvolatile memory (NVM) interface 3260.

The buffer memory 3220 may store data used to drive the controller 3200. The ECC engine 3230 may calculate error correction code values of data to be programmed during a program operation, and may correct an error of read data using an error correction code value during a read operation. In a data recovery operation, the ECC engine 3230 may correct an error of data recovered from the nonvolatile memory devices 3100. The host interface 3250 may provide an interface with an external device. The nonvolatile memory interface 3260 may provide an interface with the nonvolatile memory devices 3100.

Each of the nonvolatile memory devices 3100 may correspond to the nonvolatile memory device according to example embodiments, and may be optionally supplied with an external high voltage VPP.

A nonvolatile memory device or a storage device according to example embodiments may be packaged using various package types or package configurations.

The foregoing is illustrative of some example embodiments and is not to be construed as limiting thereof. Although a few example embodiments have been described, those of ordinary skill in the art will readily appreciate that many modifications are possible in the example embodiments without materially departing from the novel teachings and advantages of the inventive concepts. Accordingly, all such modifications are intended to be included within the scope of the inventive concepts as defined in the claims.

What is claimed is:

1. A nonvolatile memory device comprising:
   a memory cell array including a plurality of memory cells; and
   a page buffer circuit including a plurality of page buffer units and a plurality of cache latches, the plurality of page buffer units in a first horizontal direction and connected to each of the memory cells through a plurality of bit-lines, the plurality of cache latches being spaced apart from the plurality of page buffer units in the first horizontal direction, the plurality of cache latches corresponding to respective ones of the plurality of page buffer units,
   each of the plurality of page buffer units including a pass transistor connected to each sensing node and driven in response to a pass control signal, and
   the page buffer circuit being configured to perform a data transfer operation, based on performing a first data output operation to output data, the data being data used in the first data output operation being provided from a first portion of page buffer units among the plurality of page buffer units, from a first portion of cache latches among the plurality of cache latches to a data input/output (I/O) line, the data transfer operation configured to dump sensed data from a second portion of page buffer units among the plurality of page buffer units to a second portion of cache latches among the plurality of cache latches,
   the page buffer circuit configured to output the data from the first portion of cache latches while dumping the sensed data from the second portion of page buffer units to the second portion of cache latches.

2. The nonvolatile memory device of claim 1, wherein the page buffer circuit is configured to perform a first data transfer operation to dump sensed data from the first portion of the page buffer units to the first portion of cache latches during a status signal designating a busy state,
   wherein the status signal indicates operating status of the nonvolatile memory device, and
   wherein the page buffer circuit is configured to perform a second data transfer operation to dump sensed data from the second portion of page buffer units to the second portion of cache latches while the page buffer circuit performs the first data output operation during the status signal designating a ready state.

3. The nonvolatile memory device of claim 2, wherein the first portion of page buffer units performs the first data transfer operation and the first portion of page buffer units is selected from among the plurality of page buffer units based on first column addresses included in a first command sequence input to the nonvolatile memory device before data sensing period.

4. The nonvolatile memory device of claim 3, wherein
based on second column addresses being included in a second command sequence input to the nonvolatile memory device prior to the first data output operation and the first column addresses and the second column addresses belong to consecutive address space,
the page buffer circuit, after the nonvolatile memory device receiving the second command sequence, is configured to perform a second data output operation to output data transferred by the second data transfer operation while the page buffer circuit performs a third data transfer operation during the status signal designating the ready state, and
wherein the second command sequence corresponds to a random data output command sequence.

5. The nonvolatile memory device of claim 3, wherein
based on second column addresses being included in a second command sequence input to the nonvolatile memory device prior to the first data output operation and the first column addresses and the second column addresses belong to nonconsecutive address space,
the page buffer circuit is configured to perform a second data output operation, after the nonvolatile memory device receiving the second command sequence, to output data transferred by the second data transfer operation while the page buffer circuit performs a fourth data transfer operation after performing a third data transfer operation during the status signal designating the ready state.

6. The nonvolatile memory device of claim 3, wherein,
in a data transfer period, between the plurality of page buffer units and the plurality of cache latches, the pass transistors included in each of the plurality of page buffer units are connected to each other in series such that the sensing nodes included in each of the plurality of page buffer units are electrically connected to each other, and
wherein, in the data transfer period, data transfer operations between the plurality of page buffer units and the plurality of cache latches are sequentially performed.

7. The nonvolatile memory device of claim 6, wherein the plurality of page buffer units includes:
a first page buffer unit including a first pass transistor connected between a first sensing node and a first terminal, a second pass transistor connected between the first sensing node and a second terminal, a first main latch connected to the first sensing node and a first transistor connected between the first sensing node and the first main latch; and
a second page buffer unit including a third pass transistor connected between a second sensing node and the second terminal, a fourth pass transistor connected between the second sensing node and a third terminal, a second main latch connected to the second sensing node and a second transistor connected between the second sensing node and the second main latch.

8. The nonvolatile memory device of claim 7, wherein,
in the data transfer period, the first transistor and the second transistor are sequentially turned on, and data stored in each of the first main latch and the second main latch are sequentially transferred to a first cache and a cache latch, respectively and second cache latches, respectively.

9. The nonvolatile memory device of claim 7, wherein the plurality of cache latches include:
a first cache latch including a first dump transistor driven based on a first dump signal and a first transistor driven based on a first read control signal, corresponding to the first page buffer unit; and
a second cache latch including a second dump transistor driven based a second dump signal and a second transistor driven based on a second read control signal, corresponding to the second page buffer unit,
wherein, in the data transfer period, the first and second dump transistors are sequentially turned on, and data stored in each of the first main latch and the second main latch is sequentially transferred to the first cache latch and the second cache latch, respectively, and
wherein a turn-on interval of the second dump transistor overlaps with a turn-on interval of the first dump transistor.

10. The nonvolatile memory device of claim 9, wherein the page buffer circuit further includes a precharge transistor configured to precharge a combined sensing node between the second page buffer unit and the first cache latch, and
the precharge transistor is turned on in a precharge period before the first dump transistor or the second dump transistor is turned, and precharges the combined sensing node to a precharge level.

11. The nonvolatile memory device of claim 7, wherein, based on the first through fourth pass transistors being turned on, the first through fourth pass transistors are connected to each other in series, and the first and second sensing nodes are electrically connected to each other, and data is transferred from a first cache latch among the plurality of cache latches to the first main latch or from the first main latch to the first cache latch.

12. The nonvolatile memory device of claim 7, wherein, based on the third transistors and the fourth transistor being turned on, the third transistor and the fourth transistor are connected in series, such that data is transferred from the second main latch to a second cache latch among the plurality of cache latches.

13. The nonvolatile memory device of claim 1, wherein the page buffer circuit further includes a plurality of additional page buffer units in the first horizontal direction, and a plurality of additional cache latches in the first horizontal direction and corresponding to each of the plurality of additional page buffer units,
the plurality of page buffer units and the plurality of additional page buffer units are adjacent to each other in a second horizontal direction substantially perpendicular to the first horizontal direction, and
the plurality of cache latches and the plurality of additional cache latches are adjacent to each other in the second horizontal direction.

14. The nonvolatile memory device of claim 1, wherein, the memory cell array is on a first semiconductor layer, the page buffer circuit is on a second semiconductor layer, the first semiconductor layer and the second semiconductor layer are vertically stacked, and
the plurality of bit-lines extend in the first horizontal direction.

15. The nonvolatile memory device of claim 1, further comprising:
- a memory cell region including the memory cell array and a first metal pad; and
- a peripheral circuit region including the page buffer circuit and a second metal pad, the peripheral circuit region being connected to the memory cell region through the second metal pad and the first metal pad, and wherein the memory cell region is provided on a first wafer and the peripheral circuit region is provided on a second wafer.

16. A nonvolatile memory device comprising:
a first semiconductor layer including a plurality of memory cells connected to each of a plurality of bit-lines extending in a first horizontal direction; and
a second semiconductor layer in a vertical direction to the first semiconductor layer and including a page buffer circuit,
wherein the page buffer circuit includes:
- a main region including a plurality of page buffer units in the first horizontal direction; and
- a cache region adjacent to the main region in the first horizontal direction, the cache region including a plurality of cache latches in the first horizontal direction and commonly connected to a combined sensing node, the plurality of cache latches corresponding to respective ones of the plurality of page buffer units, wherein each of the plurality of page buffer units includes a pass transistor connected to each sensing node and driven based on a pass control signal, and
wherein while performing a first data output operation to output data, the data used in the first data output operation having been provided from a first portion of page buffer units among the plurality of page buffer units, from a first portion of cache latches among the plurality of cache latches to a data input/output (I/O) line, the page buffer circuit is configured to perform a data transfer operation to dump sensed data from a second portion of page buffer units among the plurality of page buffer units to a second portion of cache latches among the plurality of cache latches, the page buffer circuit configured to output the data from the first portion of cache latches while dumping the sensed data from the second portion of page buffer units to the second portion of cache latches.

17. The nonvolatile memory device of claim 16, wherein the page buffer circuit is configured to perform a first data transfer operation to dump sensed data from the first portion of the page buffer units to the first portion of cache latches during a status signal designating a busy state,
wherein the status signal indicates operating status of the nonvolatile memory device, and
wherein the page buffer circuit is configured to perform a second data transfer operation to dump sensed data from the second portion of page buffer units to the second portion of cache latches while the page buffer circuit performs the first data output operation during the status signal designating a ready state.

18. The nonvolatile memory device of claim 16, wherein the second semiconductor layer further includes a page buffer decoder adjacent to the plurality of cache latches in the first horizontal direction, and,
in a signal transfer period, between the plurality of page buffer units and the page buffer decoder, the pass transistors included in each of the plurality of page buffer units are connected to each other in series such that the sensing nodes included in each of the plurality of page buffer units are connected to the page buffer decoder.

19. A page buffer circuit comprising:
a plurality of page buffer units; and
a plurality of cache latches commonly connected to the plurality of page buffer units via a combined sensing node, the plurality of cache latches corresponding to respective ones of the plurality of page buffer units,
wherein each of the plurality of page buffer units includes a pair of pass transistors and a sensing node to connect the pair of pass transistors to each other, and
in a data transfer period, between the plurality of page buffer units and the plurality of cache latches, sensing node lines included in each of the plurality of page buffer units are connected to the combined sensing node, and the plurality of page buffer units are electrically connected to the plurality of cache latches, and
wherein while the page buffer circuit performs a first data output operation to output data, the data used in the first data output operation having been provided from a first portion of page buffer units among the plurality of page buffer units, from a first portion of cache latches among the plurality of cache latches to a data input/output (I/O) line, the page buffer circuit is configured to perform a data transfer operation to dump sensed data from a second portion of page buffer units among the plurality of page buffer units to a second portion of cache latches among the plurality of cache latches, the page buffer circuit configured to output the data from the first portion of cache latches while dumping the sensed data from the second portion of page buffer units to the second portion of cache latches.

20. The page buffer circuit of claim 19, wherein the page buffer circuit is configured to perform a first data transfer operation to dump sensed data from the first portion of the page buffer units to the first portion of cache latches during a status signal designating a busy state,
wherein the status signal indicates operating status of a nonvolatile memory device, and
wherein the page buffer circuit is configured to perform a second data transfer operation to dump sensed data from the second portion of page buffer units to the second portion of cache latches while the page buffer circuit performs the first data output operation during the status signal designating a ready state.

* * * * *